(12) United States Patent
More et al.

(10) Patent No.: US 11,581,411 B2
(45) Date of Patent: Feb. 14, 2023

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Shahaji B. More, Hsinchu (TW);
Jia-Ying Ma, Hsinchu (TW);
Cheng-Han Lee, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 71 days.

(21) Appl. No.: 17/171,253

(22) Filed: Feb. 9, 2021

(65) Prior Publication Data

US 2022/0254891 A1    Aug. 11, 2022

(51) Int. Cl.
| | | |
|---|---|---|
| H01L 29/417 | (2006.01) | |
| H01L 27/092 | (2006.01) | |
| H01L 29/08 | (2006.01) | |
| H01L 29/06 | (2006.01) | |
| H01L 29/45 | (2006.01) | |
| H01L 29/78 | (2006.01) | |
| H01L 29/66 | (2006.01) | |
| H01L 21/8238 | (2006.01) | |
| H01L 21/285 | (2006.01) | |

(52) U.S. Cl.
CPC .. *H01L 29/41791* (2013.01); *H01L 21/28518* (2013.01); *H01L 21/823814* (2013.01); *H01L 21/823821* (2013.01); *H01L 21/823871* (2013.01); *H01L 21/823878* (2013.01); *H01L 27/0924* (2013.01); *H01L 29/0653* (2013.01); *H01L 29/0847* (2013.01); *H01L 29/45* (2013.01); *H01L 29/66545* (2013.01); *H01L 29/66795* (2013.01); *H01L 29/7851* (2013.01)

(58) Field of Classification Search
CPC ......... H01L 29/41791; H01L 21/28518; H01L 21/823814; H01L 21/823821; H01L 21/823871; H01L 21/823878; H01L 27/0924; H01L 29/0653; H01L 29/0847; H01L 29/45; H01L 29/66545; H01L 29/66795; H01L 29/7851
See application file for complete search history.

(56) References Cited

U.S. PATENT DOCUMENTS 9,105,490 B2   8/2015  Wang et al.
9,236,267 B2   1/2016  De et al.
(Continued)

*Primary Examiner* — Karen Kusumakar
*Assistant Examiner* — Adam S Bowen
(74) *Attorney, Agent, or Firm* — NZ Carr Law Office

(57) ABSTRACT

A semiconductor device structure, along with methods of forming such, are described. The semiconductor device structure includes a first source/drain epitaxial feature disposed in an NMOS region, a second source/drain epitaxial feature disposed in the NMOS region, a first dielectric feature disposed between the first source/drain epitaxial feature and the second source/drain epitaxial feature, a third source/drain epitaxial feature disposed in a PMOS region, a second dielectric feature disposed between the second source/drain epitaxial feature and the third source/drain epitaxial feature, and a conductive feature disposed over the first, second, and third source/drain epitaxial features and the first and second dielectric features.

20 Claims, 31 Drawing Sheets

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2019/0326287 A1* | 10/2019 | Liaw .................. H01L 29/6681 |
| 2019/0334014 A1* | 10/2019 | Ching ................ H01L 29/6681 |

* cited by examiner

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As the geometry size decreases, semiconductor devices, such as fin field-effect transistors (FinFETs), may be negatively impacted by the short channel effect and increased source/drain electron tunneling. Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-8A are cross-sectional side views of various stages of manufacturing the semiconductor device structure of FIG. 2B taken along line A-A, in accordance with some embodiments.

FIGS. 3B-8B are cross-sectional side views of various stages of manufacturing the semiconductor device structure of FIG. 2B taken along line B-B, in accordance with some embodiments.

FIGS. 11A-13A are cross-sectional side views of various stages of manufacturing the semiconductor device structure of FIG. 2B taken along line A-A, in accordance with some embodiments.

FIGS. 11B-13B are cross-sectional side views of various stages of manufacturing the semiconductor device structure of FIG. 2B taken along line B-B, in accordance with some embodiments.

DETAILED DESCRIPTION

Figure 1A:
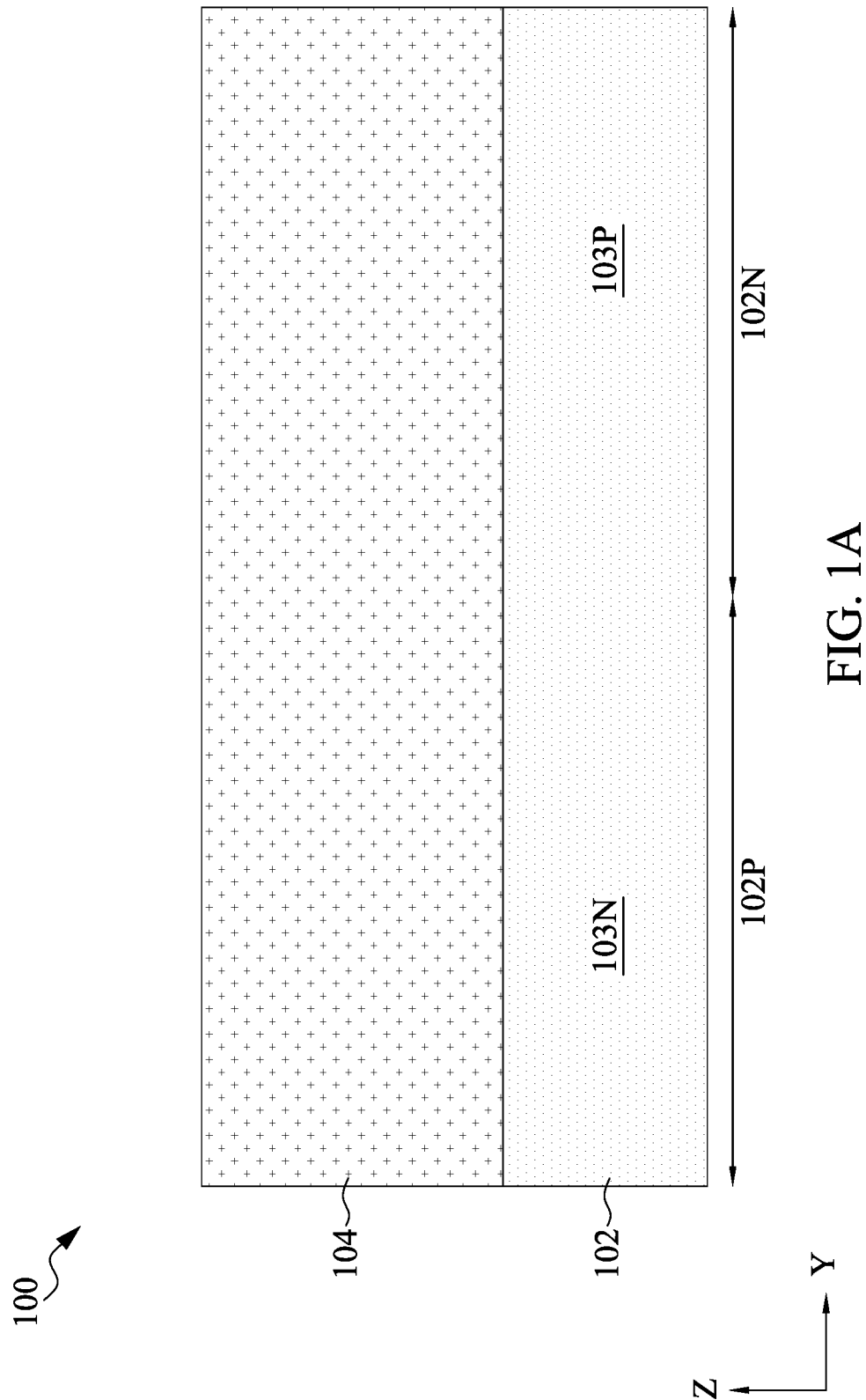
FIGS. 1A-1G are cross-sectional side views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-14 show exemplary sequential processes for manufacturing a semiconductor device structure 100, in accordance with some embodiments. It is understood that additional operations can be provided before, during, and after processes shown by FIGS. 1-14 and some of the operations described below can be replaced or eliminated, for additional embodiments of the method. The order of the operations/processes may be interchangeable.

FIGS. 1A-1G are cross-sectional side views of various stages of manufacturing a semiconductor device structure 100, in accordance with some embodiments. As shown in FIG. 1A, a first semiconductor layer 104 is formed on a substrate 102. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1A, the substrate 102 has a P-type metal-oxide-semiconductor region 102P (PMOS region 102P) and an N-type metal-oxide-semiconductor region 102N (NMOS region 102N) adjacent to the PMOS region 102P, in accordance with some embodiments. In some embodiments of the present disclosure, the PMOS region 102P is used to form a PMOS structure thereon, whereas the NMOS region 102N is used to form an NMOS structure thereon. In some embodiments, an N-well region 103N and a P-well region 103P are formed in the substrate 102, as shown in FIG. 1A. In some embodiments, the N-well region 103N is formed in the substrate 102 in the PMOS region 102P, whereas the P-well region 103P is formed in the substrate 102 in the NMOS region 102N, as shown in FIG. 1A. In some embodiments, separate ion implantation processes are performed to form the P-well region 103P and the N-well region 103N. By using two different implantation mask layers (not shown), the P-well region 103P and the N-well region 103N are sequentially formed in different ion implantation processes.

The first semiconductor layer 104 is deposited over the substrate 102, as shown in FIG. 1A. The first semiconductor layer 104 may be made of any suitable semiconductor material, such as silicon, germanium, III-V semiconductor material, or combinations thereof. In some embodiments, the first semiconductor layer 104 is substantially made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable process.

Figure 1B:
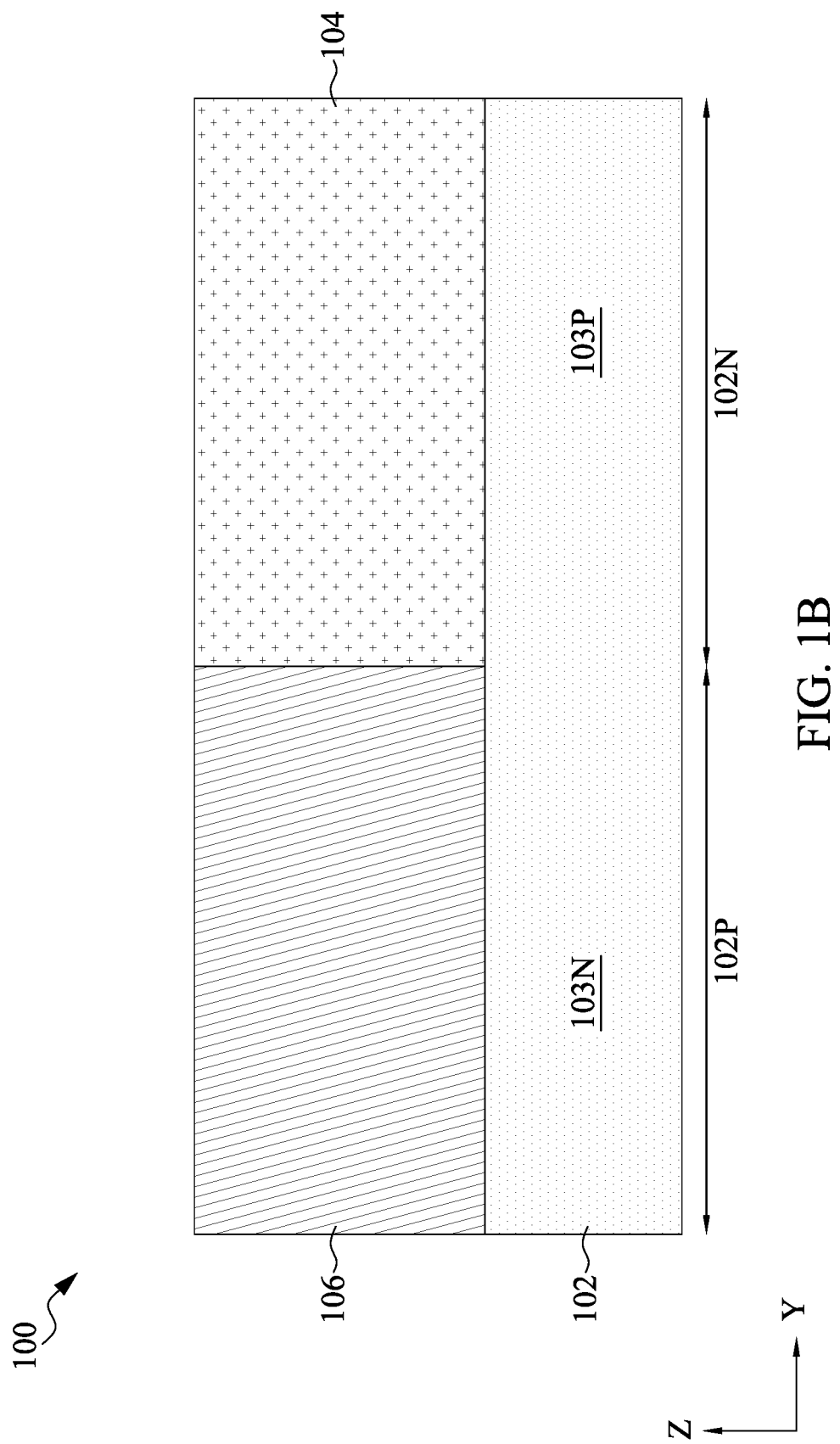

As shown in FIG. 1B, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In some embodiments, the second semiconductor layer 106 is substantially made of silicon germanium. The second semiconductor layer 106 may be formed by the same process as the first semiconductor layer 104. For example, the second semiconductor layer 106 is formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the NMOS region 102N, and the second semiconductor layer 106 is disposed over the N-well region 103N in the PMOS region 102P. Portions of the first semiconductor layer 104 may serve as channels in the subsequently formed NMOS structure in the NMOS region 102N. Portions of the second semiconductor layer 106 may serve as channels in the subsequently formed PMOS structure in the PMOS region 102P. In some embodiments, the NMOS structure and the PMOS structure are FinFETs. Other types of semiconductor devices may be utilized, such as nanosheet transistors, planar FETs, complementary FETs (CFETs), forksheet FETs, or other suitable devices.

Figure 1C:
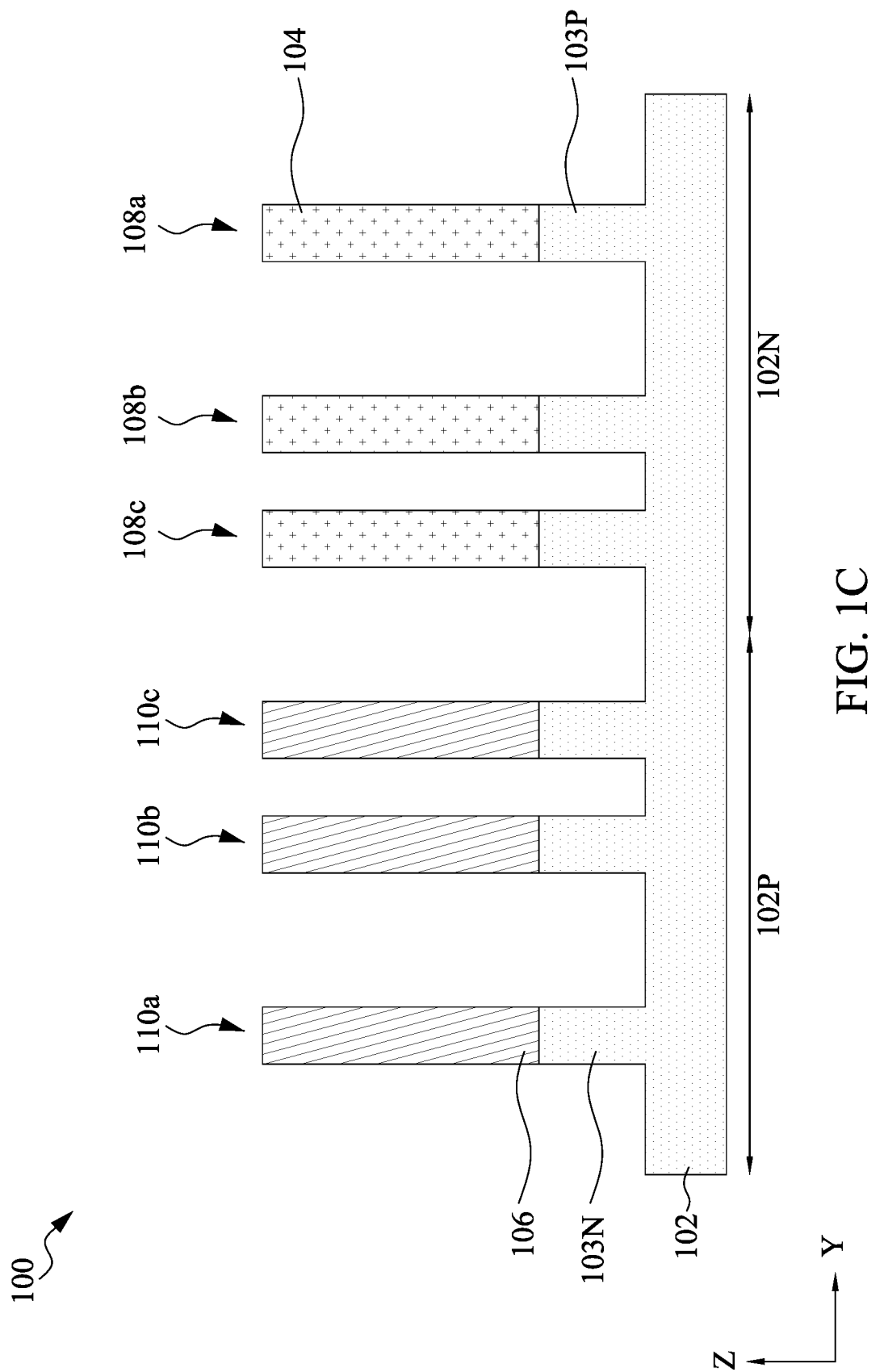

As shown in FIG. 1C, a plurality of fins 108a, 108b, 108c, 110a, 110b, 110c are formed. The fins 108a, 108b, 108c, 110a, 110b, 110c may be patterned by any suitable method. For example, the fins 108a, 108b, 108c, 110a, 110b, 110c may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the fins.

The fins 108a, 108b, 108c may each include the first semiconductor layer 104, and a portion of the first semiconductor layer 104 may serve as an NMOS channel. Each fin 108a, 108b, 108c may also include the P-well region 103P. The fins 110a, 110b, 110c may each include the second semiconductor layer 106, and a portion of the second semiconductor layer 106 may serve as a PMOS channel. Each fin 110a, 110b, 110c may also include the N-well region 103N. A mask (not shown) may be formed on the first and second semiconductor layers 104, 106, and may remain on the fins 108a-c and 110a-c.

Figure 1D:
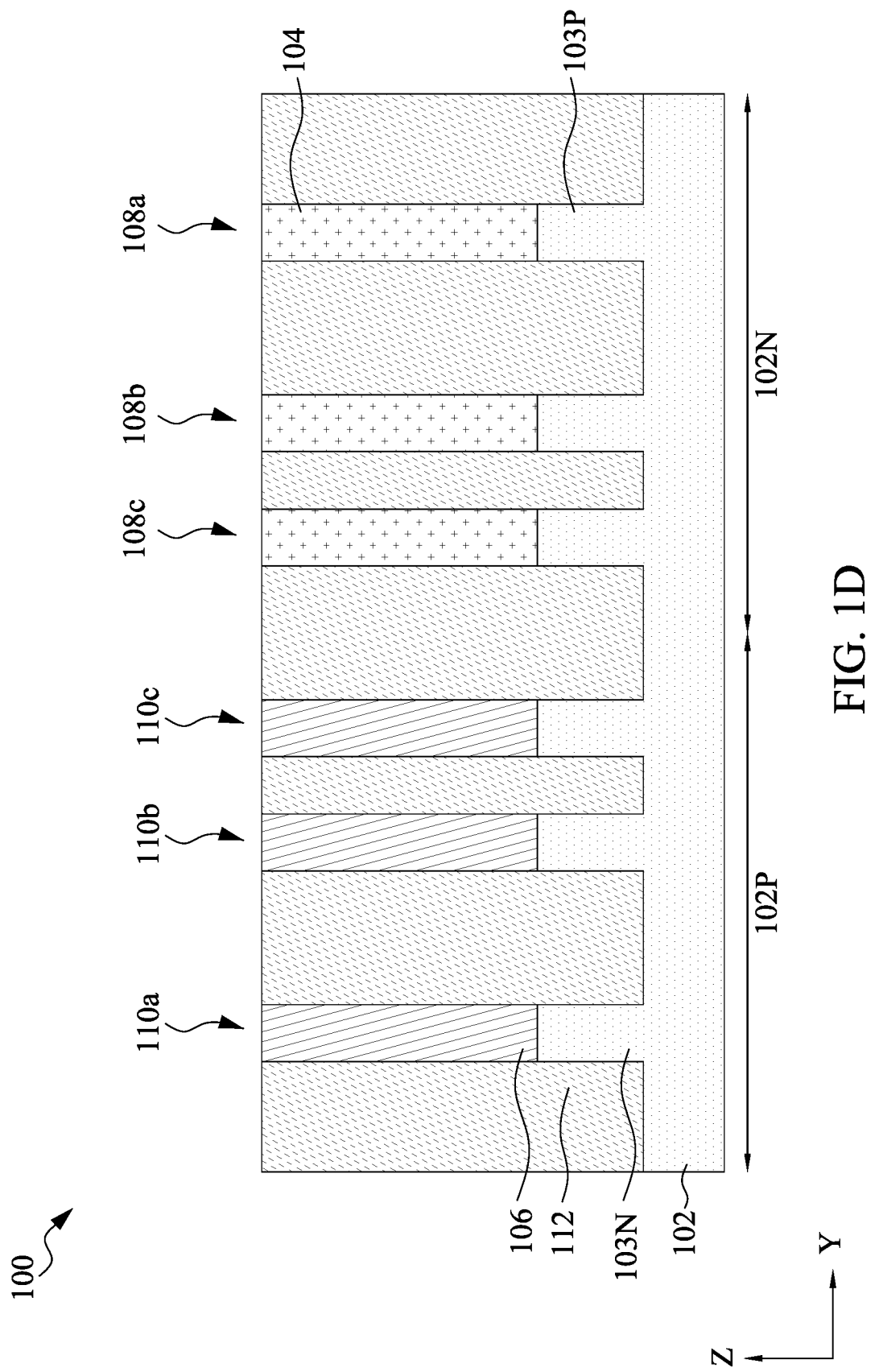

As shown in FIG. 1D, an insulating material 112 is formed between adjacent fins 108a-c, 110a-c. The insulating material 112 may be first formed between adjacent fins 108a-c, 110a-c and over the fins 108a-c, 110a-c, so the fins 108a-c, 110a-c are embedded in the insulating material 112. A planarization process, such as a chemical-mechanical polishing (CMP) process may be performed to expose the top of the fins 108a-c, 110a-c, as shown in FIG. 1D. In some embodiments, the planarization process exposes the top of the mask (not shown) disposed on the fins 108a-c and 110a-c. The insulating material 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating material 112 may be formed by any suitable method, such as low-pressure chemical vapor deposition (LPCVD), plasma enhanced CVD (PECVD) or flowable CVD (FCVD).

Figure 1E:
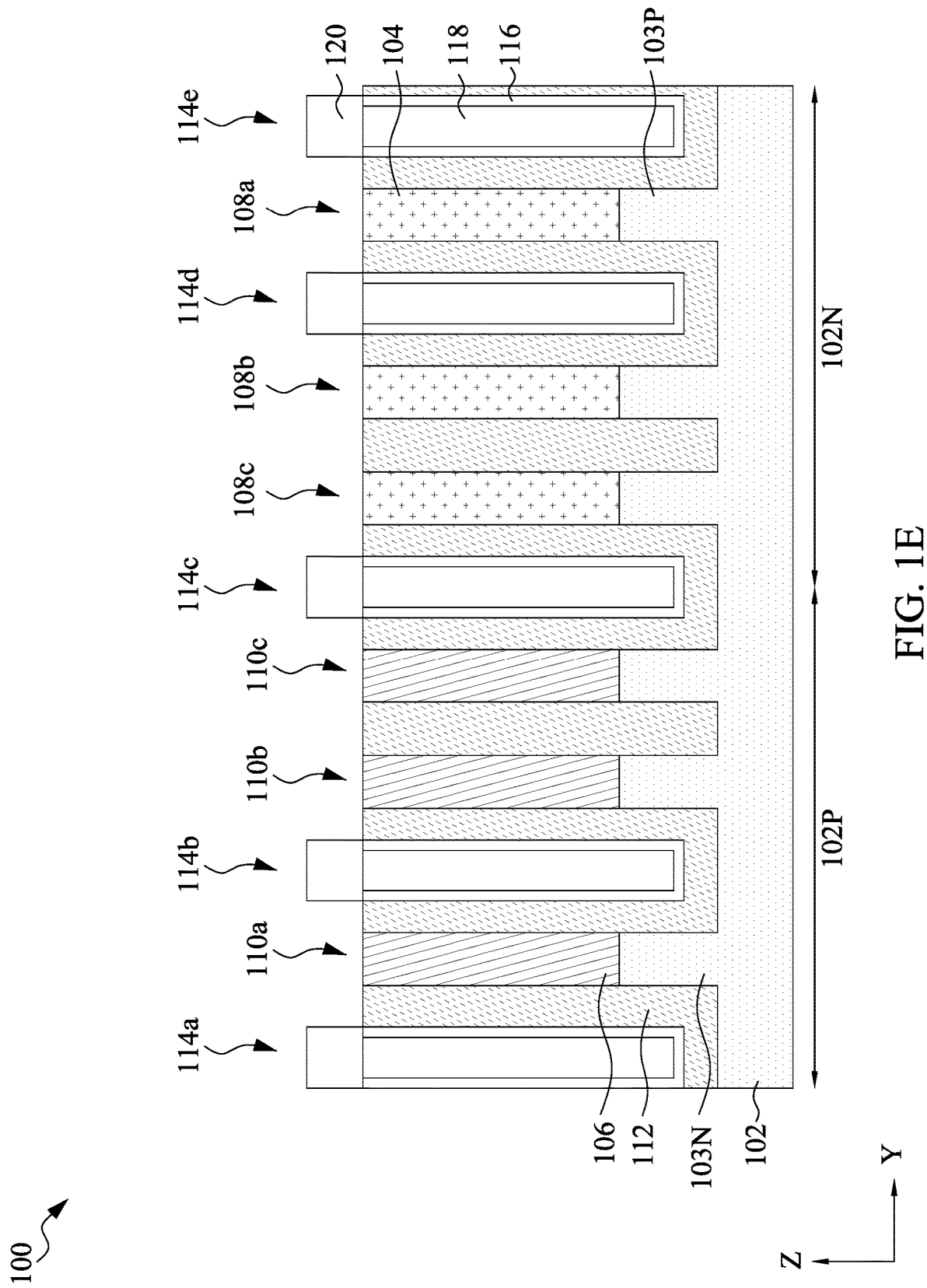

As shown in FIG. 1E, a plurality of dielectric features 114a, 114b, 114c, 114d, 114e are formed in the insulating material 112. In some embodiments, each dielectric feature 114a, 114b, 114c, 114d, 114e may include a liner 116, a low-K dielectric material 118, and a high-K dielectric material 120. The liner 116 may include a dielectric material such as $SiO_2$, SiN, SiCN, SiOC, SiOCN, or other suitable dielectric material. The liner 116 may be formed by a conformal process, such as an ALD process. The low-K dielectric material 118 may be formed on the liner 116 and between adjacent fins 108a-c, 110a-c. The low-K dielectric material 118 may include silicon, oxygen, hydrogen, and/or combinations thereof. The low-K dielectric material 118 may have a K value less than about 3.5. The low-K dielectric material 118 may be formed by any suitable process, such as CVD or FCVD. The high-K dielectric material 120 is formed on each liner 116 and low-K dielectric material 118, as shown in FIG. 1E. The high-K dielectric material 120 may include a material having a K value higher than that of silicon dioxide. In some embodiments, the high-K dielectric material 120 includes SiN, SiC, SiCN, SiON, SiOCN, AlO, AlN, AlON, ZrO, ZrN, ZrAlO, HfO, or other suitable dielectric material. The high-K dielectric material 120 may be formed by any suitable process, such as a CVD, PECVD, FCVD, or ALD process. The dielectric features 114a-e may be dielectric fins that separate subsequently formed source/drain (S/D) epitaxial features and electrode layers. In some embodiments, each dielectric feature 114a-e has a width ranging from about 10 nm to about 40 nm. In some embodiments, the dielectric features 114a-e may have a height along the Z-axis greater than, equal to, or less than a height of the fins 108a-c, 110a-c.

Figure 1F:
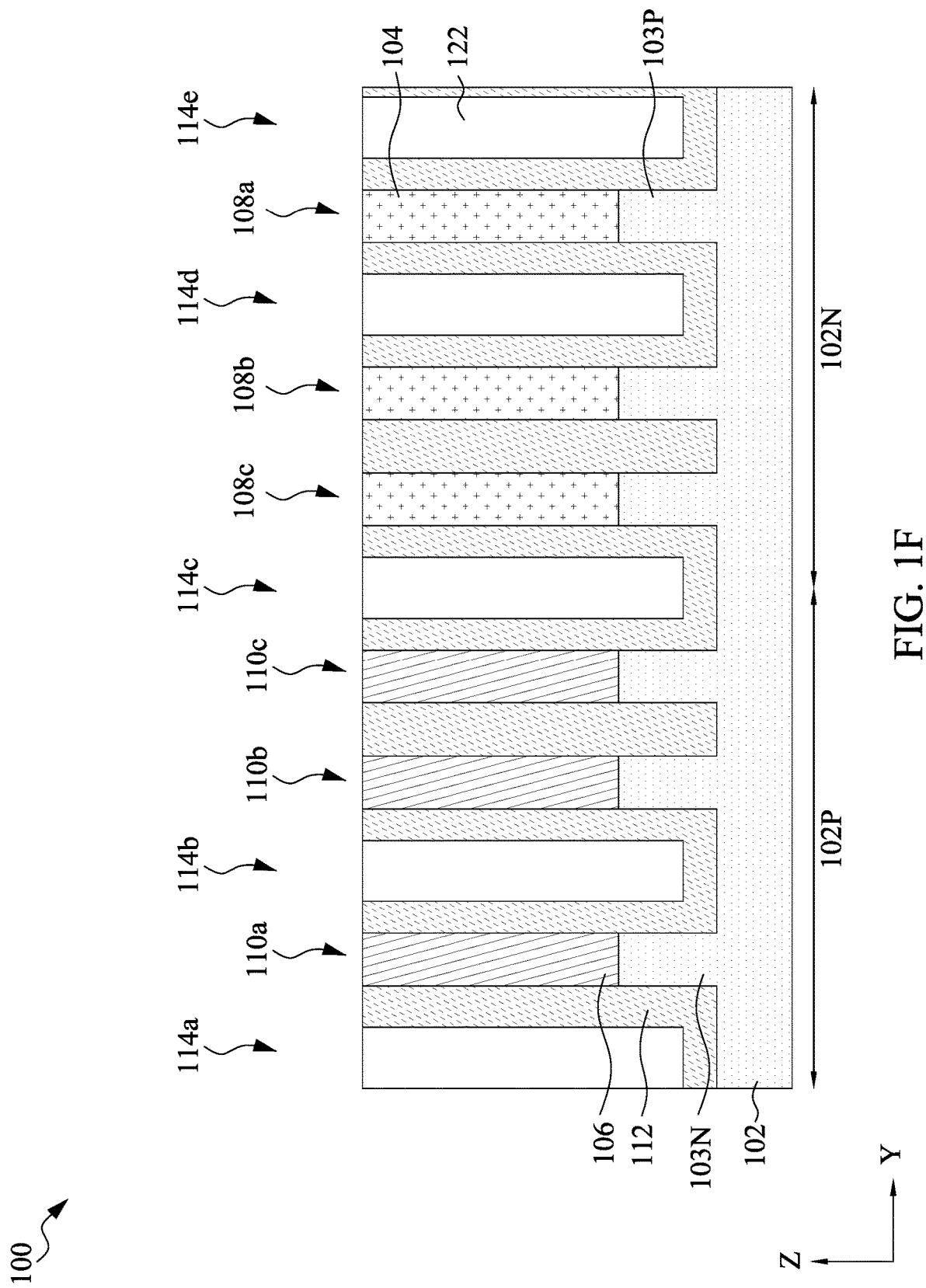

In some embodiments, as shown in FIG. 1F, each of the dielectric features 114a-e includes a single dielectric material 122 instead of the liner 116, the low-K dielectric material 118, and the high-K dielectric material 120. The dielectric material 122 may include any suitable dielectric material, such as $SiO_2$, SiN, SiCN, SiOC, SiOCN, doped $SiO_2$, or porous $SiO_2$. The dielectric material 122 may be formed by any suitable process, such as CVD, PECVD, FCVD, or ALD. In some embodiments, the dielectric features 114a-e may each include one or more dielectric materials for separating subsequently formed S/D epitaxial features and gate electrode layers. In some embodiments, the height of the dielectric features 114a-e is substantially the same as the height of the fins 108a-c, 110a-c. In some embodiments, the height of the dielectric features 114a-e is substantially less than the height of the fins 108a-c, 110a-c.

Figure 1G:
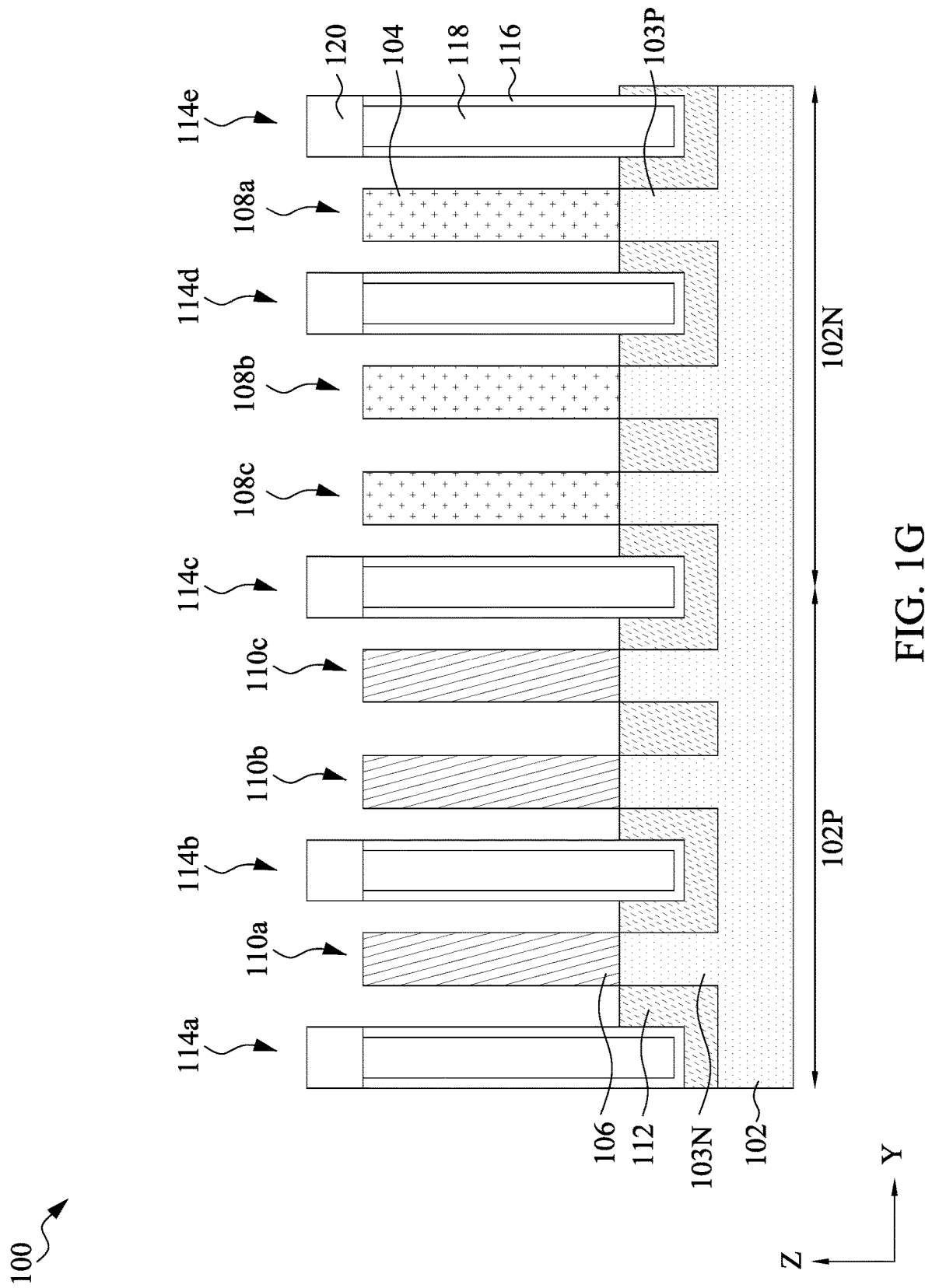

As shown in FIG. 1G, the insulating material 112 may be recessed by removing a portion of the insulating material 112 located on both sides of each fin 108a-c, 110a-c. The insulating material 112 may be recessed by any suitable removal process, such as dry etch or wet etch that selectively removes the insulating material 112 but does not substantially affect the semiconductor materials of the fins 108a-c, 110a-c, the liner 116, and the high-K dielectric material 120. The recessed insulating material 112 may be the shallow trench isolation (STI).

Figure 2A:
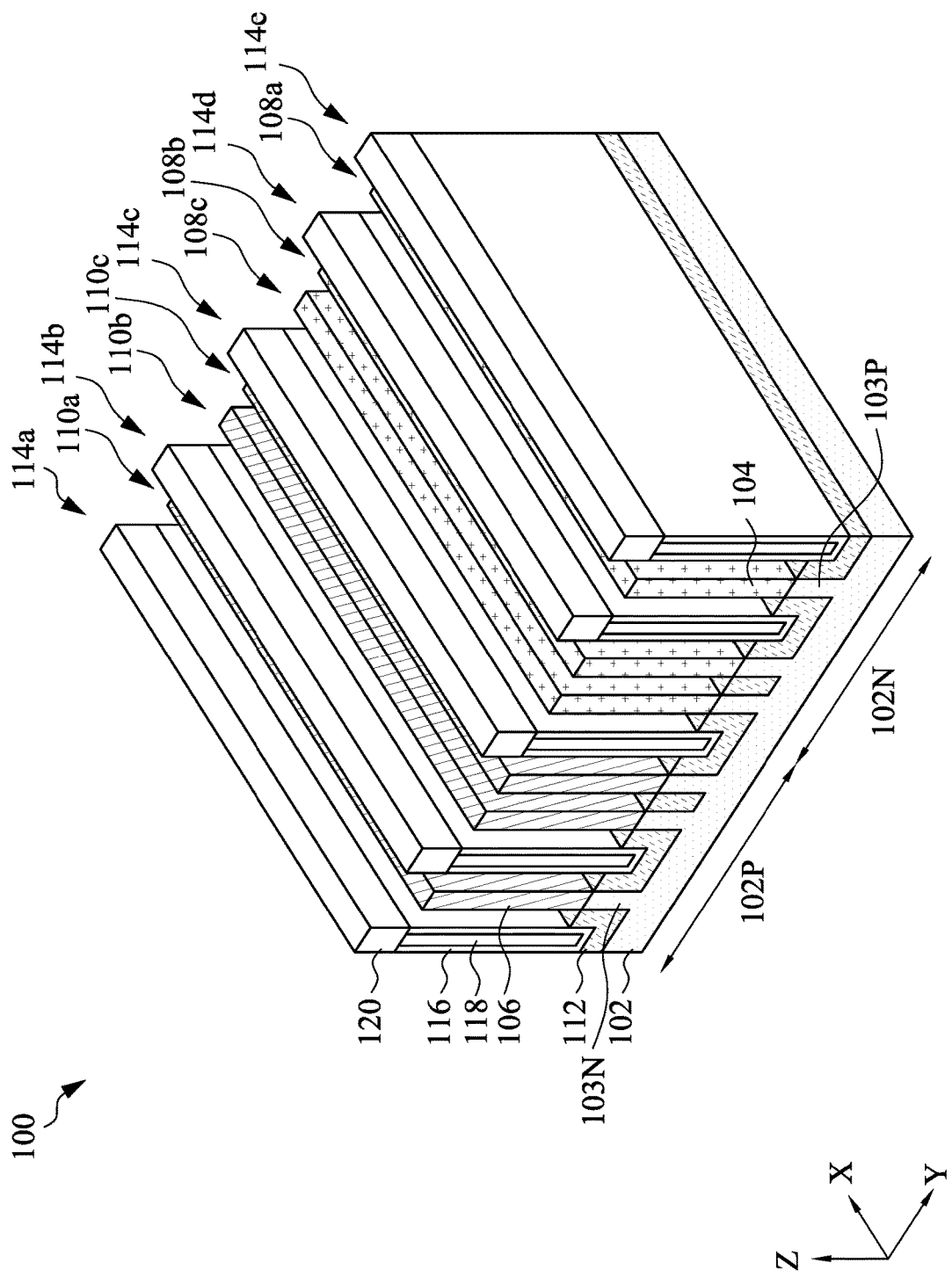
FIGS. 2A and 2B are perspective views of various stages of manufacturing the semiconductor device structure, in accordance with some embodiments.
Figure 2B:
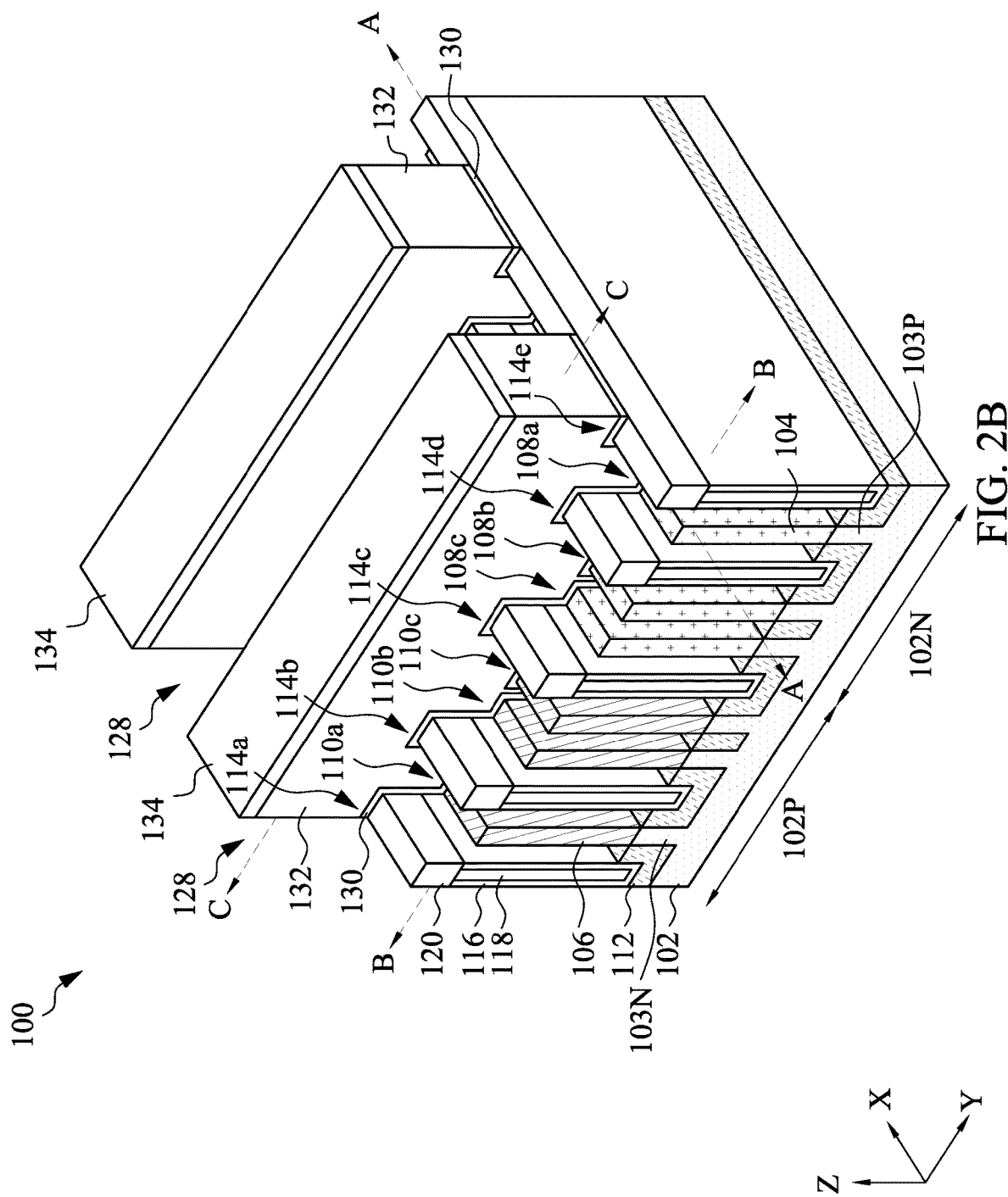

FIGS. 2A and 2B are perspective views of various stages of manufacturing the semiconductor device structure 100, in accordance with some embodiments. FIG. 2A is a perspective view of the stage of manufacturing the semiconductor device structure 100 as shown in FIG. 1G. As shown in FIG. 2B, one or more sacrificial gate stacks 128 are formed on a portion of the fins 108a-c, 110a-c and dielectric features 114a-e. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 includes a material different than that of the insulating material 112 or the high-K dielectric material 120. In some embodiments, the sacrificial gate dielectric layer 130 may be deposited by a CVD process, a sub-atmospheric CVD (SACVD) process, a FCVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 128, the fins 108a-c, 110a-c are partially exposed on opposite sides of the sacrificial gate stacks 128. As illustrated in FIG. 2B, two sacrificial gate stacks 128 are formed, which is for illustrative purpose and not intended to be limiting beyond what is specifically recited in the claims. It can be appreciated that any number of the sacrificial gate stacks 128 may be formed.

Figure 3A:
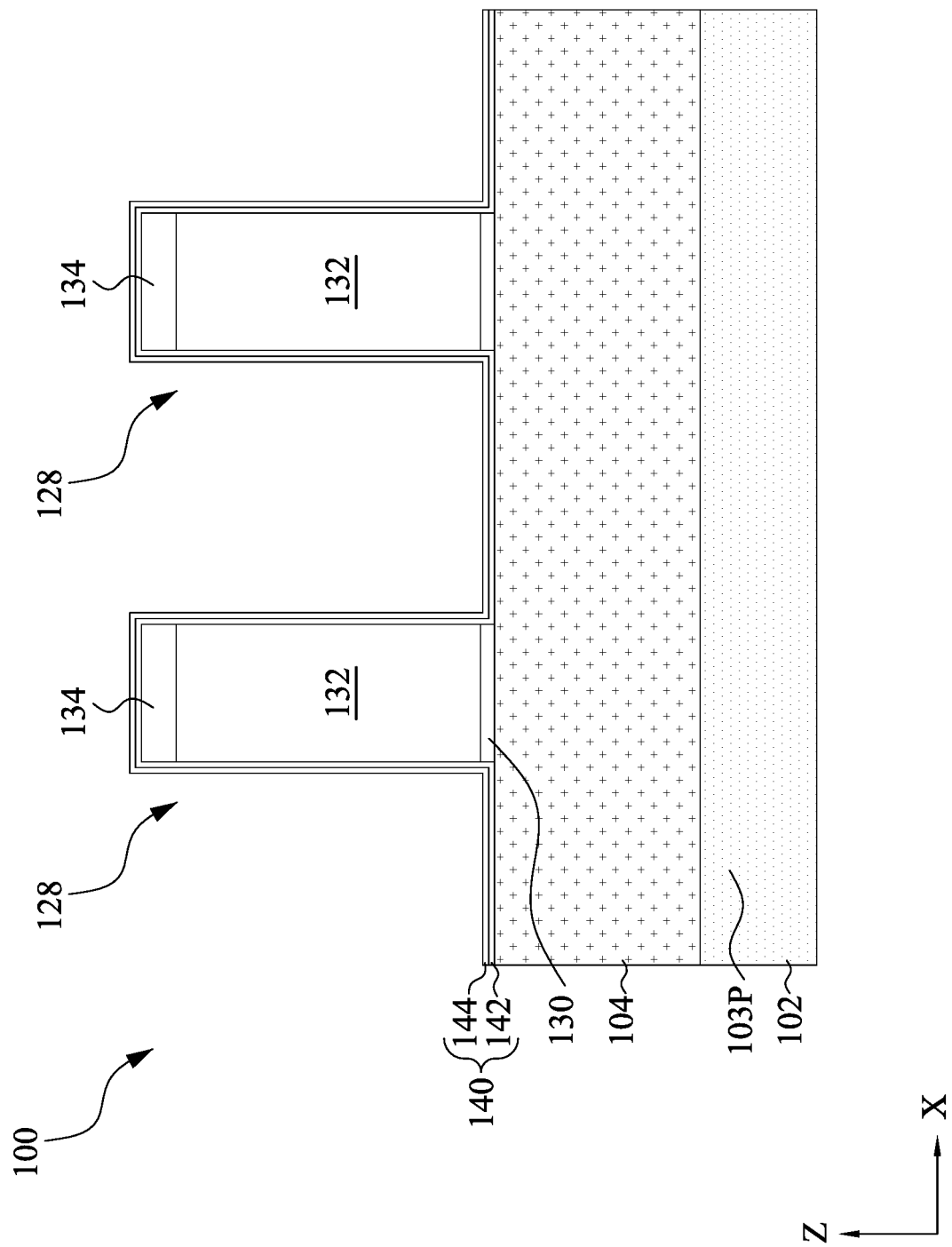
Figure 3B:
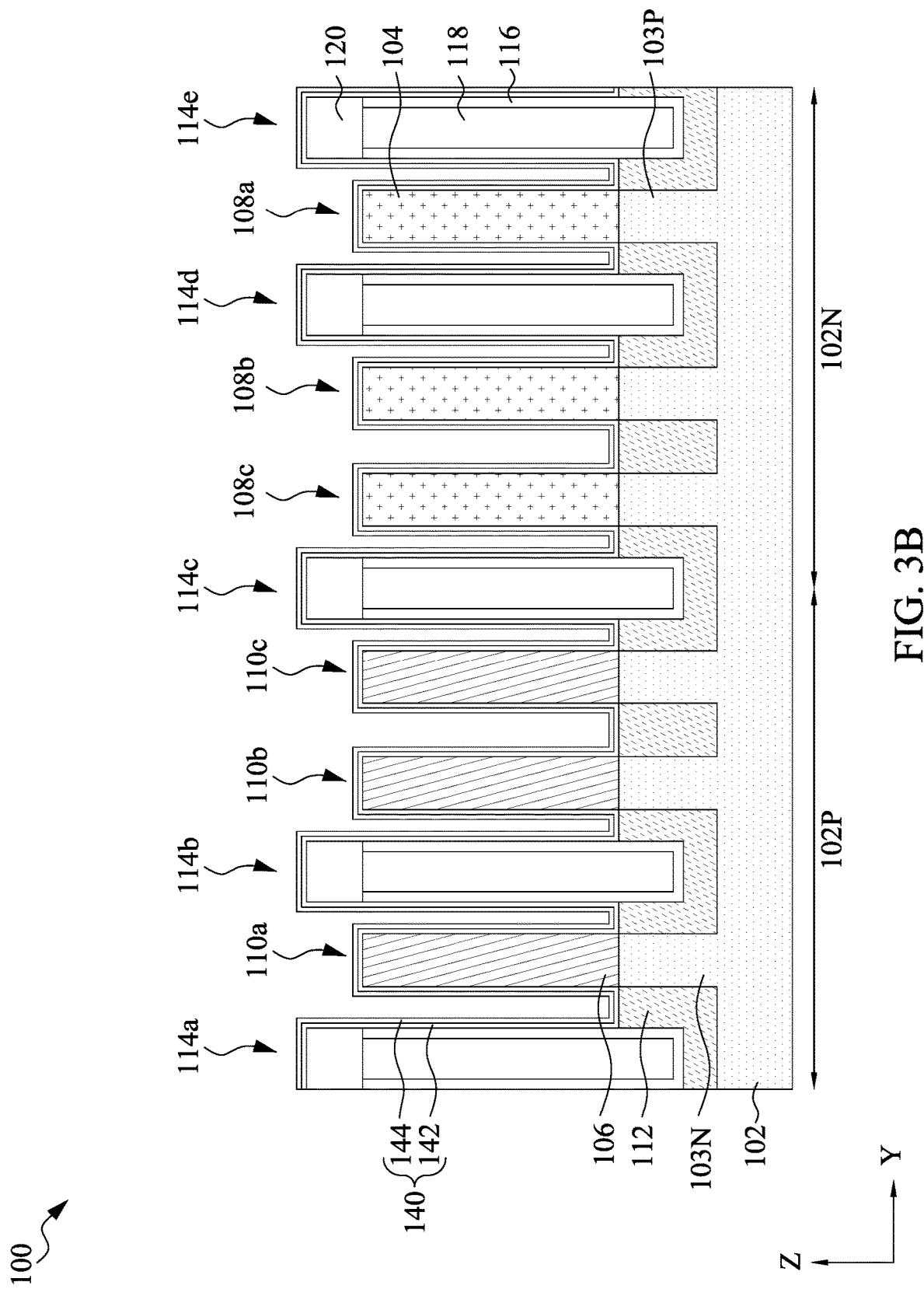

FIGS. 3A-8A are cross-sectional side views of various stages of manufacturing the semiconductor device structure 100 of FIG. 2B taken along line A-A, in accordance with some embodiments. FIGS. 3B-8B are cross-sectional side views of various stages of manufacturing the semiconductor device structure 100 of FIG. 2B taken along line B-B, in accordance with some embodiments. As shown in FIG. 3A, a spacer 140 is formed on the sacrificial gate stacks 128 and the exposed portions of the first semiconductor layer 104. In some embodiments, the spacer 140 includes a first layer 142 and a second layer 144, as shown in FIG. 3A. The first and second layers 142, 144 may be conformally deposited on the exposed surfaces of the semiconductor device structure 100. The conformal first and second layers 142, 144 may be formed by ALD processes. The first and second layers 142, 144 may be made of a dielectric material such as silicon oxide, silicon nitride, silicon carbide, silicon oxynitride, SiCN, silicon oxycarbide, SiOCN, and/or combinations thereof. In some embodiments, the first and second layers 142, 144 include different materials. In some embodiments, the spacer 140 includes one layer. In some embodiments, the spacer 140 includes more than two layers. As shown in FIG. 3B, the spacer 140 is also formed on the exposed portions of the second semiconductor layer 106 and the dielectric features 104a-e.

Figure 4A:
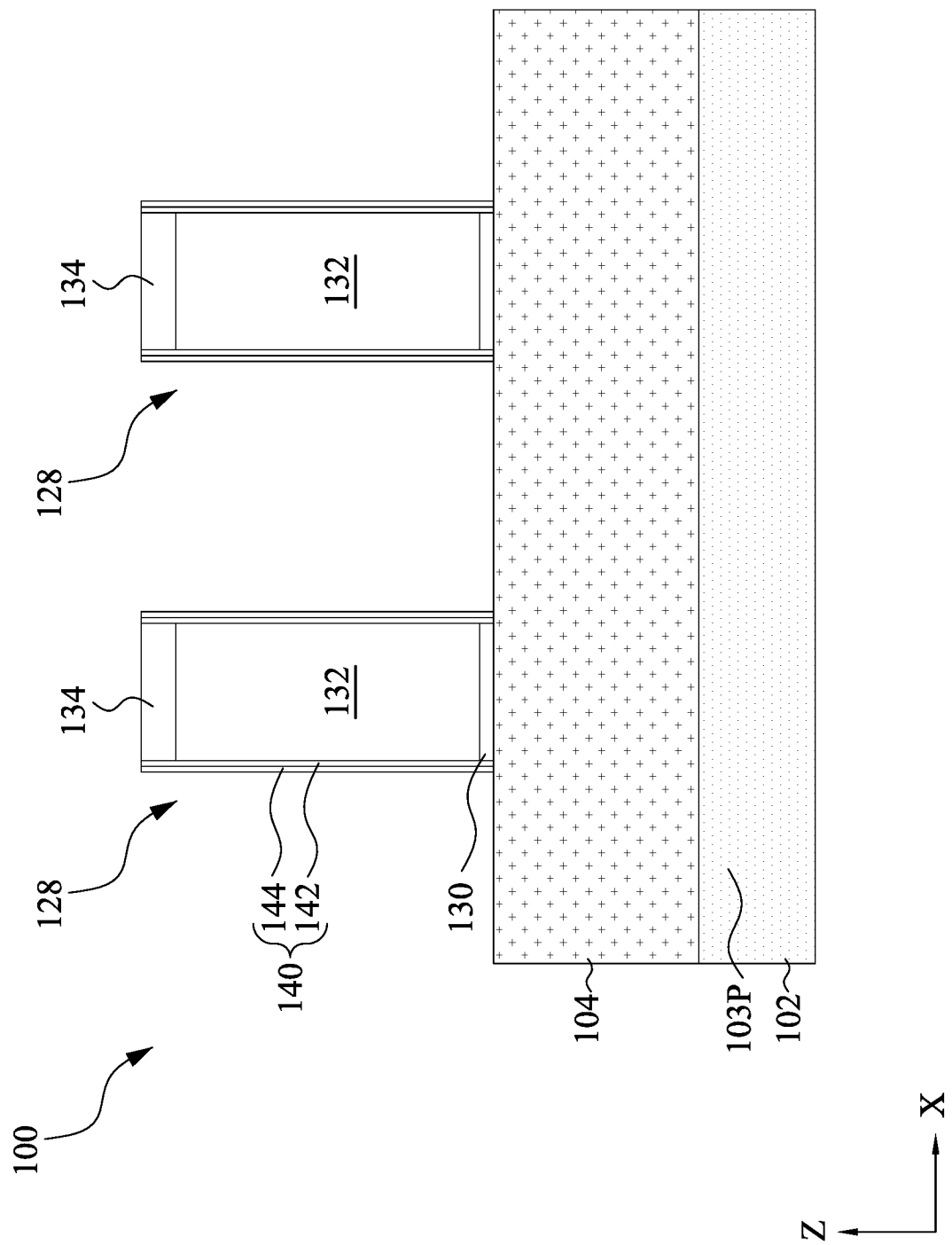
Figure 4B:
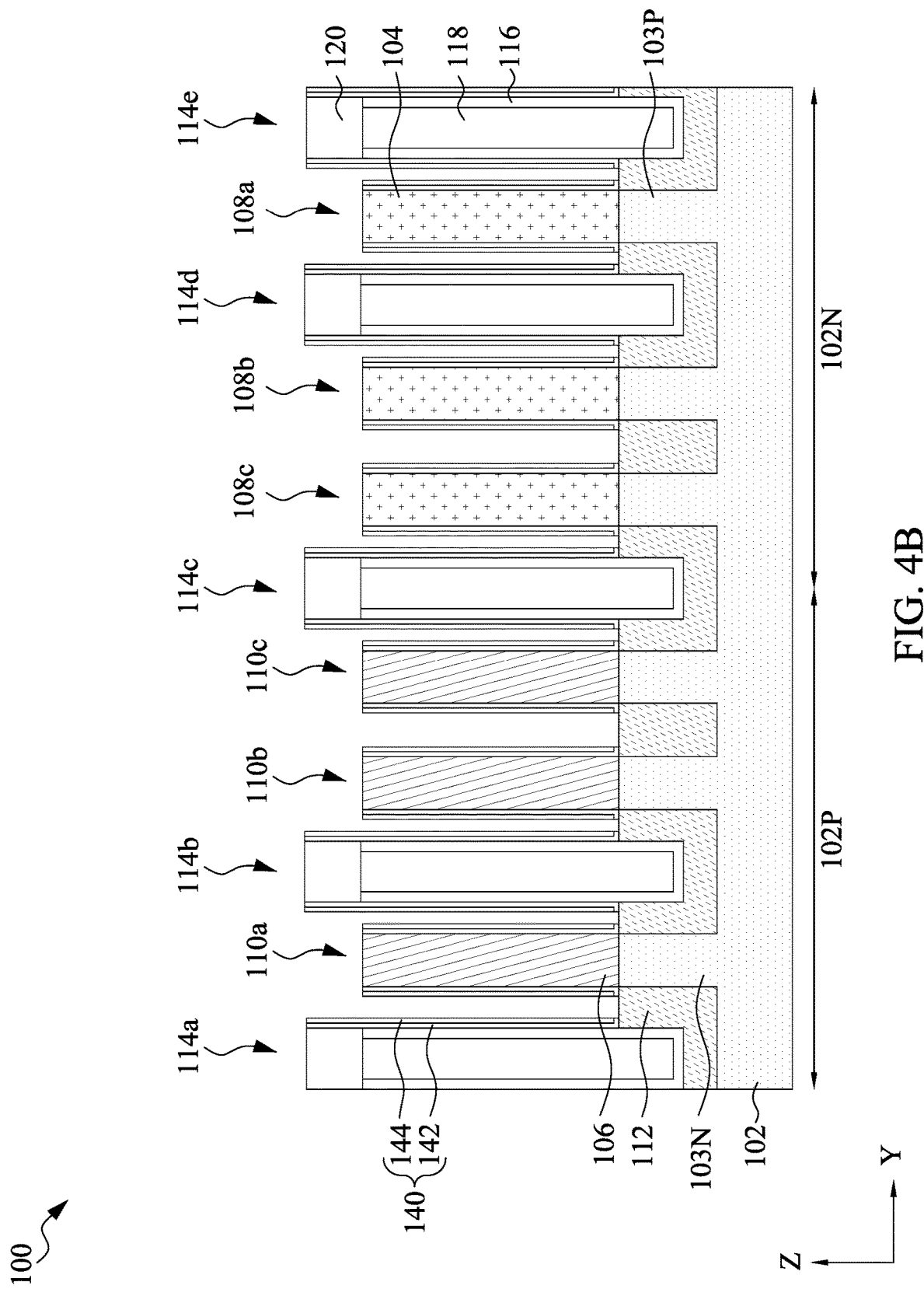

As shown in FIGS. 4A and 4B, an anisotropic etch is performed on the spacer 140 using, for example, RIE. During the anisotropic etch process, most of the spacer 140 is removed from horizontal surfaces, such as tops of the sacrificial gate stacks 128, tops of the fins 108a-c, 110a-c, and tops of the dielectric features 114a-e, leaving the spacer 140 on the vertical surfaces, such as the sidewalls of sacrificial gate stacks 128, sidewalls of the fins 108a-c, 110a-c, and sidewalls of the dielectric features 114a-e.

Figure 5A:
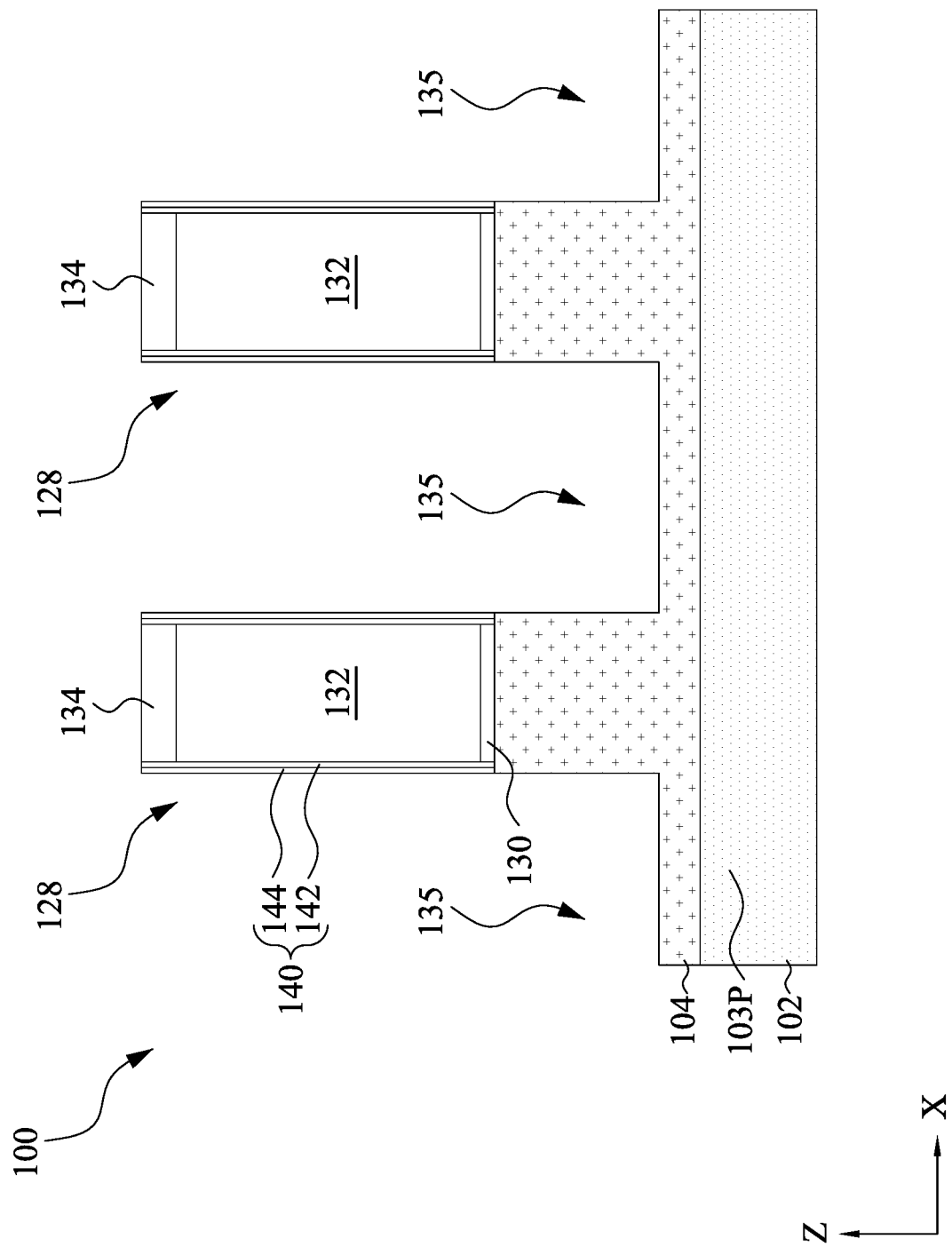
Figure 5B:
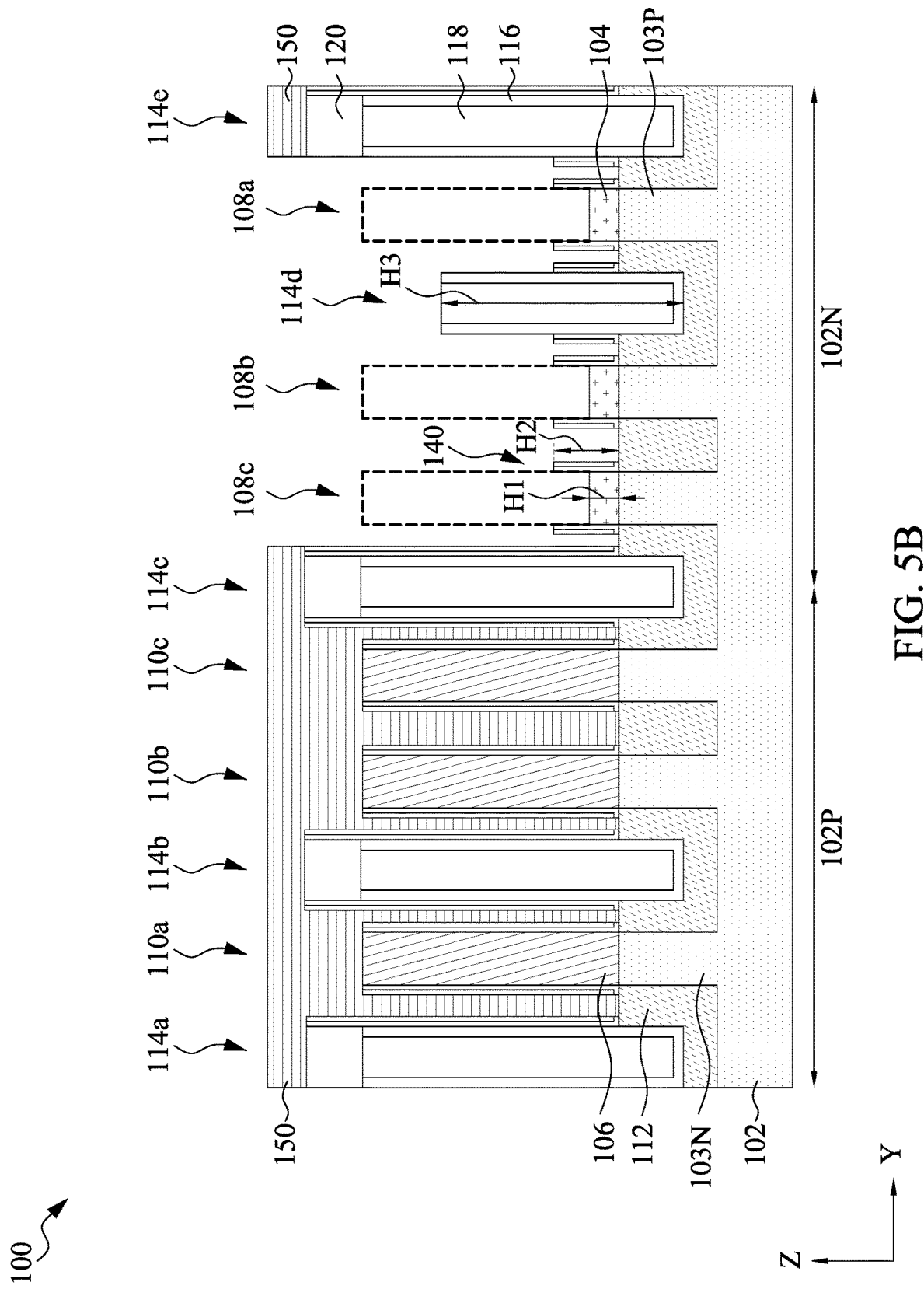

As shown in FIG. 5B, a mask 150 is formed on the PMOS region 102P and on the dielectric feature 114e which may separate the NMOS region 102N from another PMOS region 102P (not shown). A sacrificial liner (not shown) may be formed on the PMOS region 102P and the dielectric feature 114e, and the mask 150 is formed on the sacrificial liner. The mask 150 may be a patterned photoresist layer. The materials disposed in the NMOS region 102N are not covered by the mask 150 and are exposed. Next, the exposed materials not covered by the sacrificial gate stacks 128 and the mask 150, such as exposed portions of the fins 108a-c, the dielectric feature 114d, and the spacer 140 disposed on the sidewalls of the fins 108a-c and the dielectric feature 114d are recessed to form openings 135, as shown in FIGS. 5A and 5B. As shown in FIG. 5B, the fins 108a-c covered by the sacrificial gate stacks 128 are shown in dotted lines. The recess of the materials may be performed by a dry etch, a wet etch, or a combination thereof. In some embodiments, etchant such as tetramethylammonium hydroxide (TMAH), $CF_4$, $CHF_3$, $O_2$, $H_3$, $CH_4$, Ar, $Ch_3F$, HBr, He, or combinations thereof may be used to recess the materials. For example, combinations such as $CH_4$ plus Ar, $Ch_3F$ plus $O_2$ plus $CH_4$, or HBr plus He may be used to recess the materials. The etchant is selected so different materials have different etch rates. For example, the semiconductor material of the fins 108a-c may have a first etch rate by the etchant, the spacer 140 may have a second etch rate by the etchant, and the dielectric feature 114d has a third etch rate by the etchant. In the embodiments where the spacer 140 and the dielectric feature 114d each includes different materials, the second and the third etch rate may be an average etch rate of the different materials. In some embodiments, the first etch rate is faster than the second etch rate, which is faster than the third etch rate. As a result, each of the first semiconductor layer 104 of the fins 108a-c has a first height H1, each spacer layer 140 has a second height H2 greater than the first height H1, and the dielectric feature 114d has a third height H3 greater than the second height H2. In some embodiments, the first semiconductor layer 104 of each fin 108a-c are removed, and the height H1 is substantially nonexistent. In some embodiments, the height H1 is substantially greater than the height H2 and substantially less than the height H3. After the recessing of the materials by the etch process, a clean process may be performed. The clean process may use solutions such as HF, high temperature sulfuric peroxide mixture (HTSPM), and ammonia plus hydrogen peroxide.

Figure 6A:
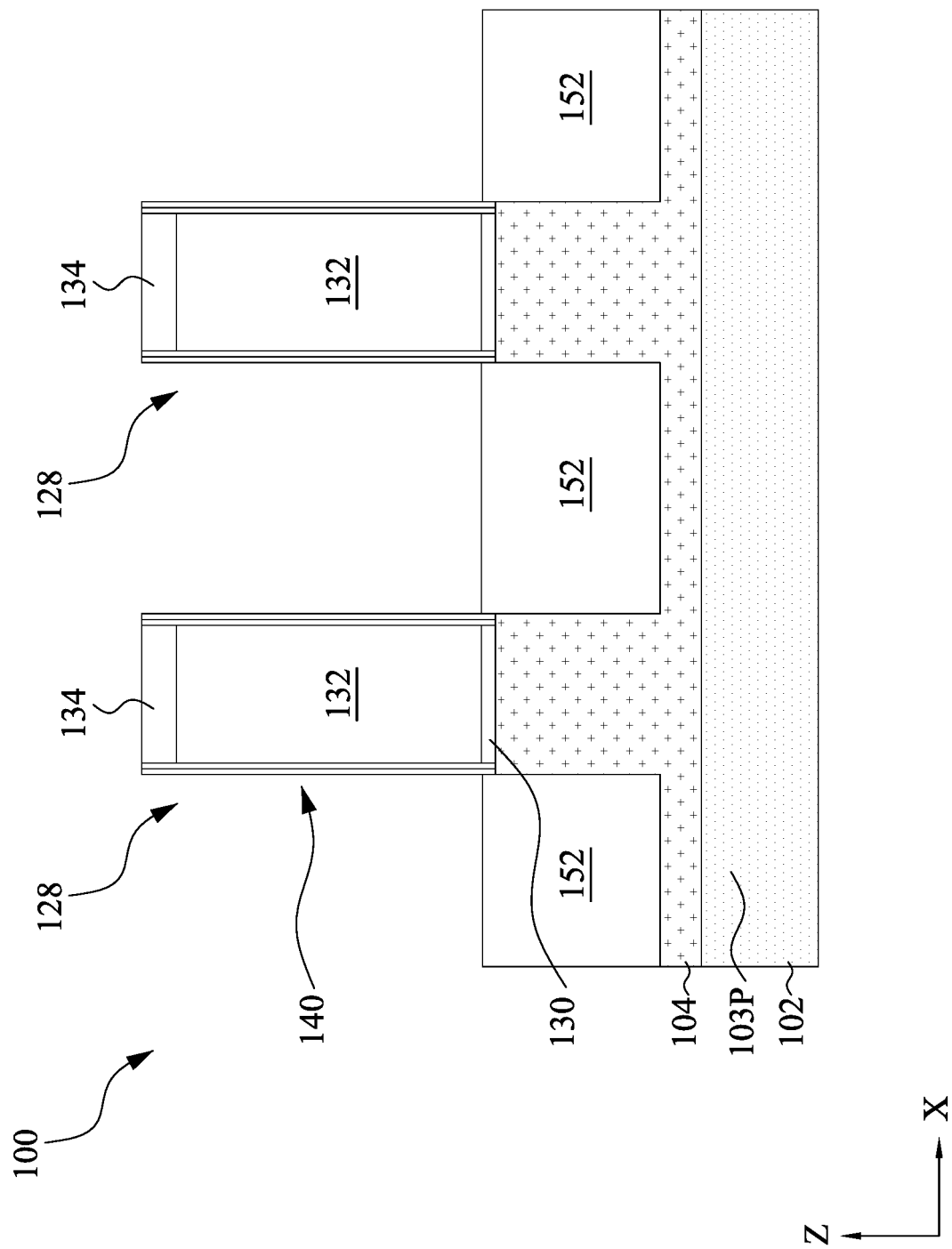
Figure 6B:
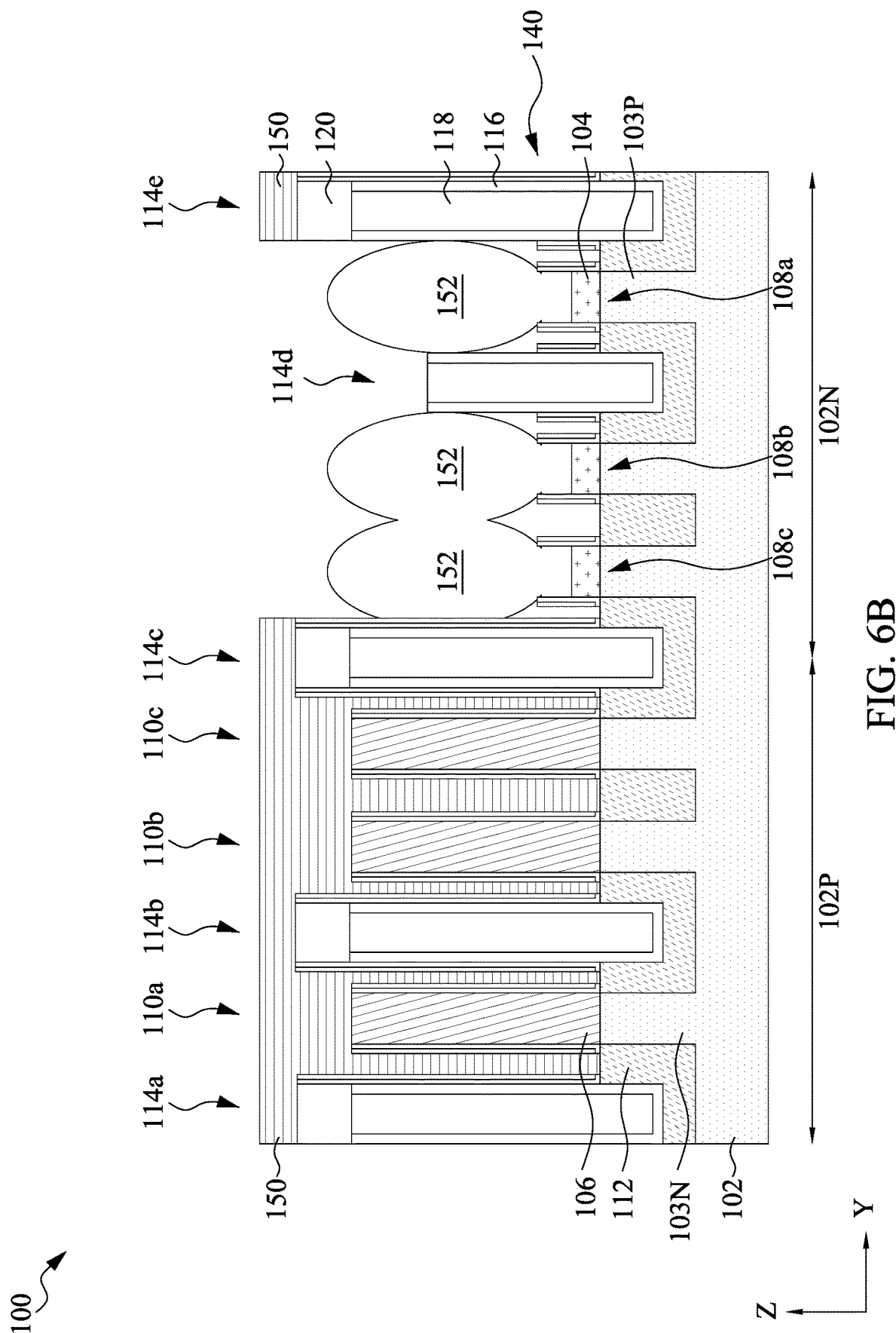

As shown in FIGS. 6A and 6B, S/D epitaxial features 152 are formed. In some embodiments, each S/D epitaxial features 152 may include one or more layers of Si, SiP, SiC, or SiCP for NMOS devices. In some embodiments, each S/D epitaxial feature 152 includes two or more layers of Si, SiP, SiC, or SiCP, and each layer has a different silicon concentration. Each S/D epitaxial feature 152 may include N-type dopants, such as phosphorus (P), arsenic (As), or other suitable N-type dopants. The S/D epitaxial features 152 may be formed by any suitable method, such as CVD, CVD epitaxy, MBE, or other suitable method. The S/D epitaxial features 152 may be formed on the remaining portion of the first semiconductor layer 104 of the fins 108a-c on both sides of each sacrificial gate stack 128, as shown in FIGS. 6A and 6B. In some embodiments, the portions of the first semiconductor layer 104 on both sides of each sacrificial gate stack 128 are completely removed, and the S/D epitaxial features 152 are formed on the P-well region 103P of the fins 108a-c. The S/D epitaxial features 152 may each have a top surface at a level higher than a top surface of the first semiconductor layer 104, as shown in FIG. 6A.

In some embodiments, the S/D epitaxial features 152 formed on the remaining portion of the first semiconductor layer 104 of the fins 108b and 108c are merged, as shown in FIG. 6B, and the S/D epitaxial feature 152 formed on the remaining portion of the first semiconductor layer 104 of the fin 108a is separated from the S/D epitaxial feature 152 formed on the remaining portion of the first semiconductor layer 104 of the fin 108b by the dielectric feature 114d having the height H3. The distance between the adjacent fins 108a-c and the location of the dielectric feature 114d determines whether the adjacent S/D epitaxial features 152 are merged. For example, the distance between the fin 108a and fin 108b is large enough for placing the dielectric feature 114d between the fin 108a and the fin 108b. Thus, the S/D epitaxial feature 152 formed on the remaining portion of the first semiconductor layer 104 of the fin 108a is not merged with the S/D epitaxial feature 152 formed on the remaining portion of the first semiconductor layer 104 of the fin 108b because the dielectric feature 114d is located between the two S/D epitaxial features 152. The distance between the fin 108b and the fin 108c is small, and there is no dielectric feature located between the fin 108b and the fin 108c to separate the S/D epitaxial features 152 formed on the remaining portion of the first semiconductor layer 104 of the fin 108b and the fin 108c. Thus, the S/D epitaxial features 152 formed on the remaining portion of the first semiconductor layer 104 of the fins 108b, 108c are merged, as shown in FIG. 6B.

Figure 7A:
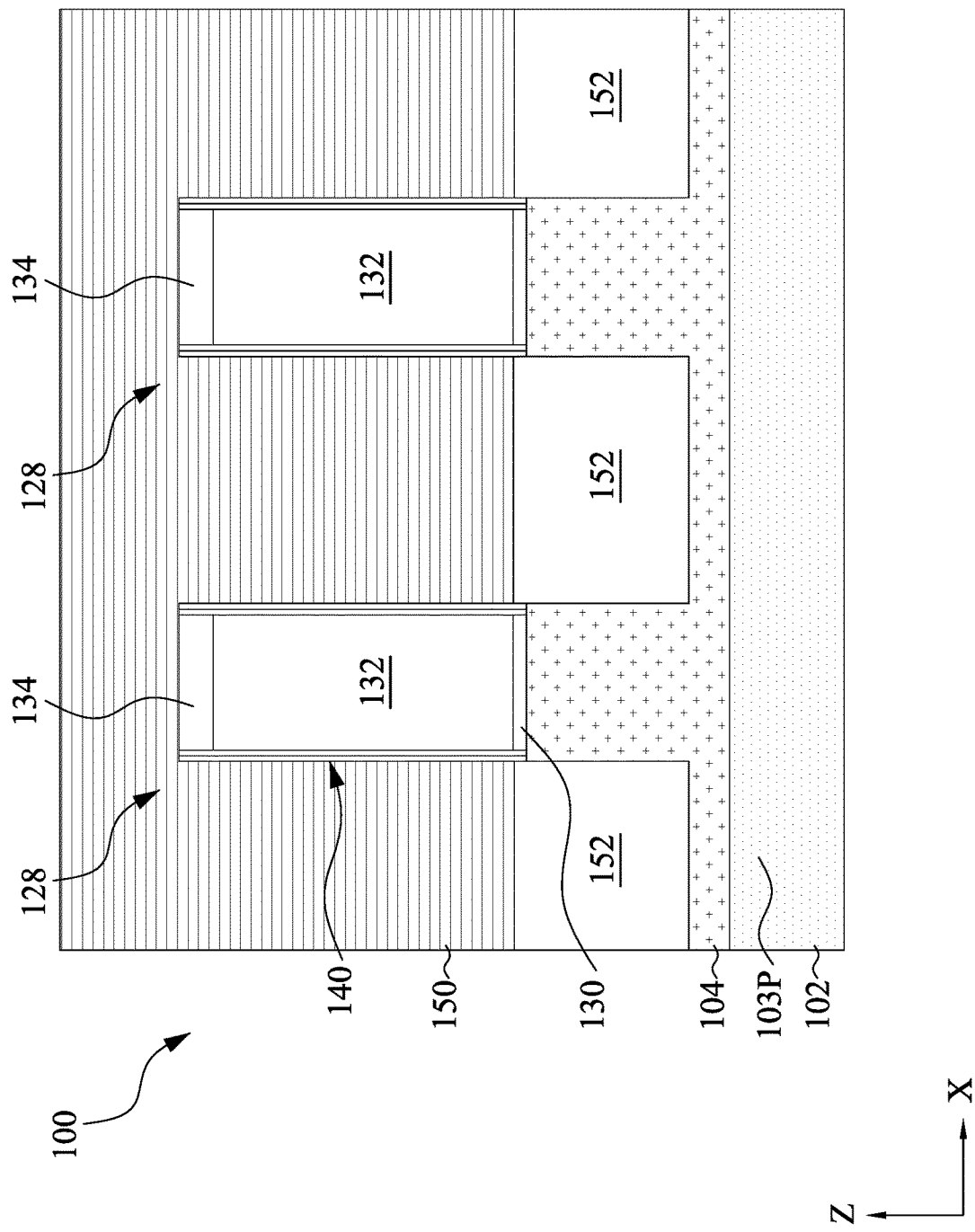
Figure 7B:
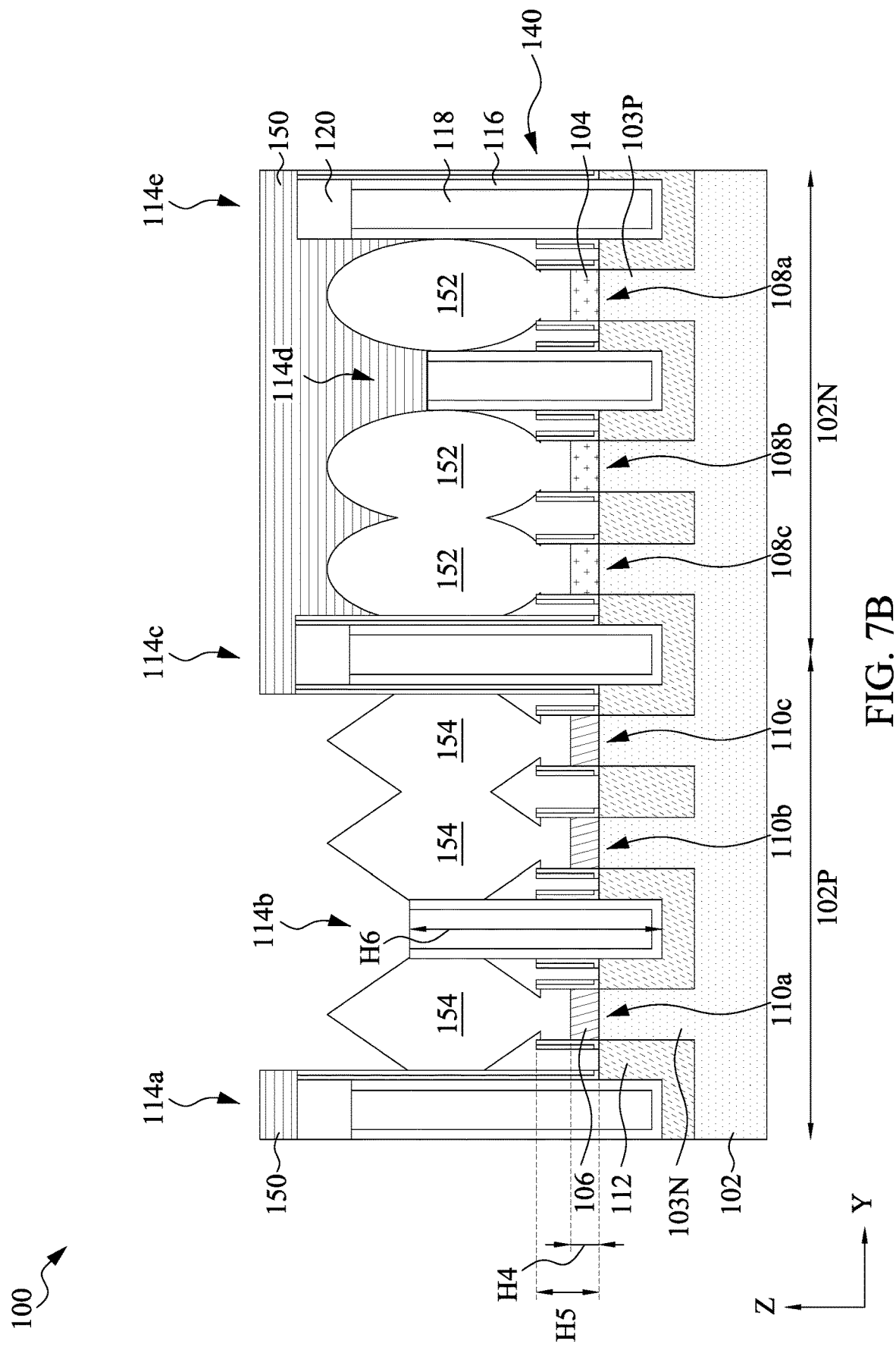

As shown in FIGS. 7A and 7B, the mask 150 formed on the PMOS region 102P is removed to expose the fins 110a-c (FIG. 6B) and the dielectric feature 114b (FIG. 6B), and the mask 150 is formed on the NMOS region 102N and on the dielectric features 114a, 114c, 114e. Next, the exposed materials not covered by the sacrificial gate stacks 128 and the mask 150, such as exposed portions of the fins 110a-c, the dielectric feature 114b, and the spacer 140 disposed on the sidewalls of the fins 110a-c and the dielectric feature 114b, are recessed, as shown in FIGS. 7A and 7B. The recess of the materials may be performed by the same process described in FIGS. 5A and 5B. In some embodiments, the process is a wet or dry etch process utilizing an etchant that recesses different materials at different rates. For example, the semiconductor material of the fins 110a-c may have a first etch rate by the etchant, the spacer 140 may have a second etch rate by the etchant, and the dielectric feature 114b may have a third etch rate by the etchant. In the embodiments where the spacer 140 and the dielectric feature 114b each includes different materials, the second and the third etch rate may be an average etch rate of the different materials. In some embodiments, the first etch rate is faster than the second etch rate, which is faster than the third etch rate. As a result, each of the second semiconductor layer 106 of the fins 110a-c has a fourth height H4, each spacer layer 140 has a fifth height H5 greater than the fourth height H4, and the dielectric feature 114b has a sixth height H6 greater than the fifth height H5. In some embodiments, the second semiconductor layer 106 of each fin 110a-c are removed, and the height H4 is substantially nonexistent. In some embodiments, the height H4 is substantially greater than the height H5 and substantially less than the height H6. In some embodiments, the fourth height H4 is greater than or equal to the first height H1 (FIG. 5B) of the first semiconductor layer 104, the fifth height H5 is greater than or equal to the second height H2 (FIG. 5B) of the spacer 140, and the sixth height H6 is greater than or equal to the third height H3 of the dielectric feature 114d.

As shown in FIGS. 7A and 7B, S/D epitaxial features 154 are formed. In some embodiments, each S/D epitaxial features 154 may include one or more layers of Si, SiGe, or Ge for PMOS devices. In some embodiments, each S/D epitaxial feature 154 includes two or more layers of Si, SiGe, or Ge, and each layer has a different silicon or germanium concentration. Each S/D epitaxial feature 154 may include P-type dopants, such as boron (B) or other suitable P-type dopants. The S/D epitaxial features 154 may be formed by any suitable method, such as CVD, CVD epitaxy, MBE, or other suitable method. The S/D epitaxial features 154 may be formed on the remaining portion of the second semiconductor layer 106 of the fins 110a-c on both sides of each sacrificial gate stack 128, as shown in FIGS. 7A and 7B. In some embodiments, the portions of the second semiconductor layer 106 on both sides of each sacrificial gate stack 128 are completely removed, and the S/D epitaxial features 154 are formed on the N-well region 103N of the fins 110a-c.

In some embodiments, the S/D epitaxial features 154 formed on the remaining portion of the second semiconductor layer 106 of the fins 110b and 110c are merged, and the S/D epitaxial feature 154 formed on the remaining portion of the second semiconductor layer 106 of the fin 110a is separated from the S/D epitaxial feature 154 formed on the remaining portion of the second semiconductor layer 106 of the fin 110b by the dielectric feature 114b having the height H6, as shown in FIG. 7B. In some embodiments, the height H6 of the dielectric feature 114b is substantially greater than the height H3 of the dielectric feature 114d in order to prevent S/D epitaxial features 154 from unintentionally merging. The S/D epitaxial feature 154 has a greater lateral dimension compared to the S/D epitaxial feature 152 due to the crystal structure of the materials of the S/D epitaxial feature 154. In some embodiments, if the height H6 of the dielectric feature 114b is substantially the same as the height H3 of the dielectric feature 114d, the S/D epitaxial feature 154 formed on the fin 110a may unintentionally merge with the S/D epitaxial feature 154 formed on the fin 110b.

The distance between the adjacent fins 110a-c and the location of the dielectric feature 114b determines whether the adjacent S/D epitaxial features 154 are merged. For example, the distance between the fin 110a and fin 110b is large enough for placing the dielectric feature 114b between the fin 110a and the fin 110b. Thus, the S/D epitaxial feature 154 formed on the fin 110a is not merged with the S/D epitaxial feature 154 formed on the fin 110b because the dielectric feature 114b having the height H6 is located between the two S/D epitaxial features 154. The distance between the fin 110b and the fin 110c is small, and there is no dielectric feature located between the fin 110b and the fin 110c to separate the S/D epitaxial features 154 formed on the fin 110b and the fin 110c. Thus, the S/D epitaxial features 154 formed on the fins 110b, 110c are merged, as shown in FIG. 7B.

Figure 8A:
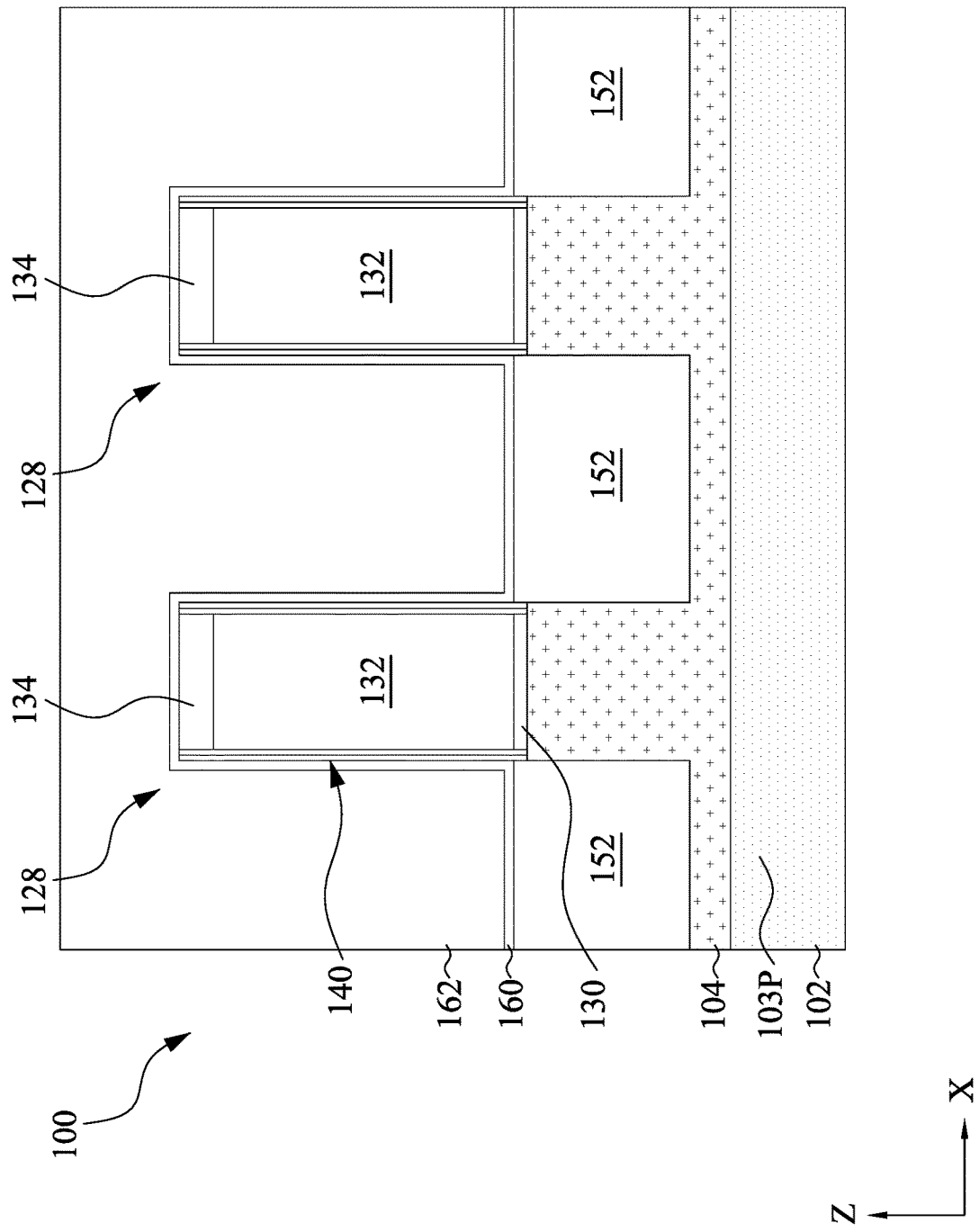
Figure 8B:
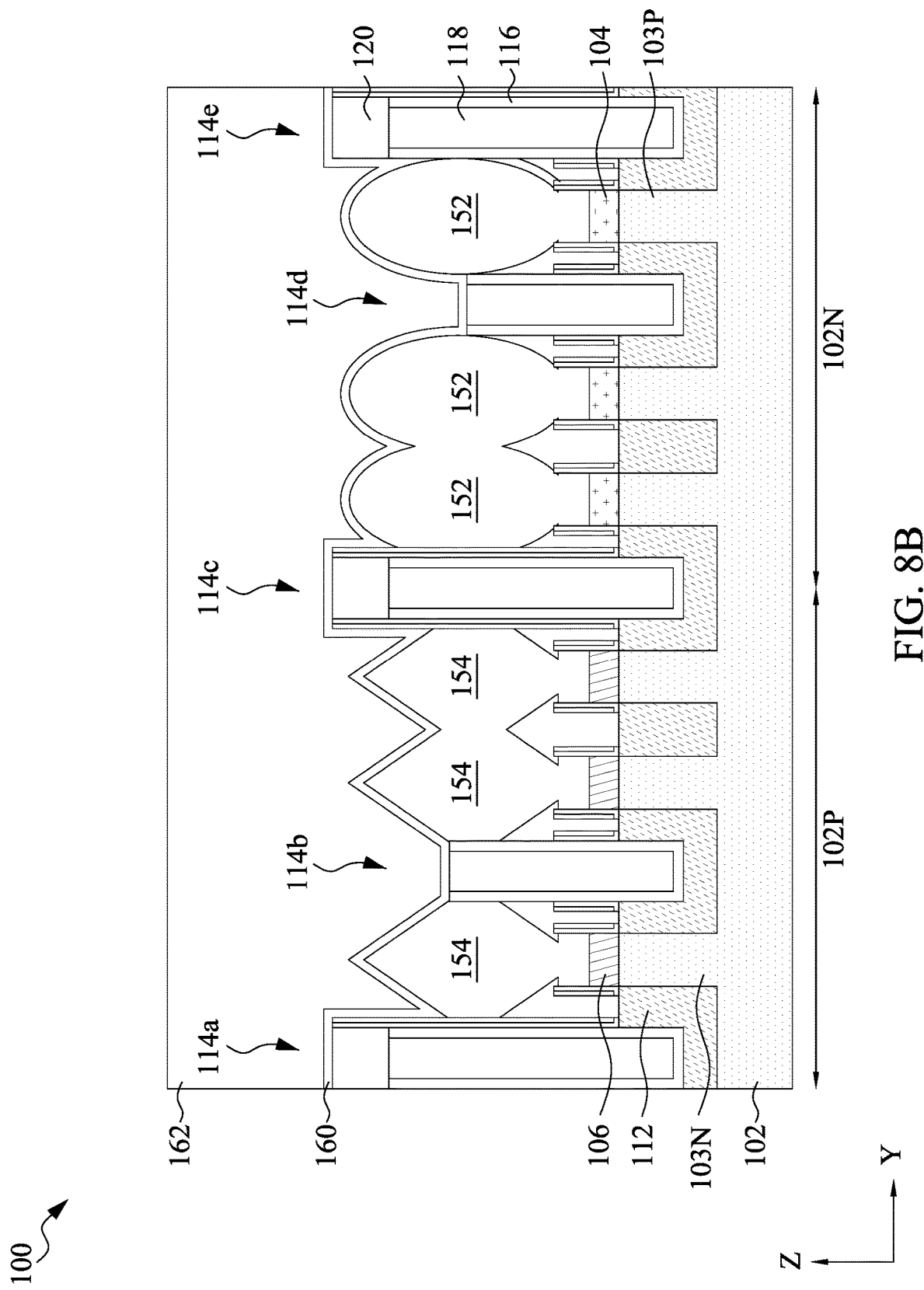

As shown in FIGS. 8A and 8B, a contact etch stop layer (CESL) 160 may be formed on the S/D epitaxial features 152, 154 and the dielectric features 114a-e. The CESL 160 may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL 160 may be formed by CVD, PECVD, ALD, or any suitable deposition technique. In some embodiments, the CESL 160 is a conformal layer formed by the ALD process. An interlayer dielectric (ILD) layer 162 may be formed on the CESL 160. The ILD layer 162 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 162 may be deposited by a PECVD process or other suitable deposition technique. In some embodiments, after formation of the ILD layer 162, the semiconductor device structure 100 may be subject to a thermal process to anneal the ILD layer 162.

Figure 9:
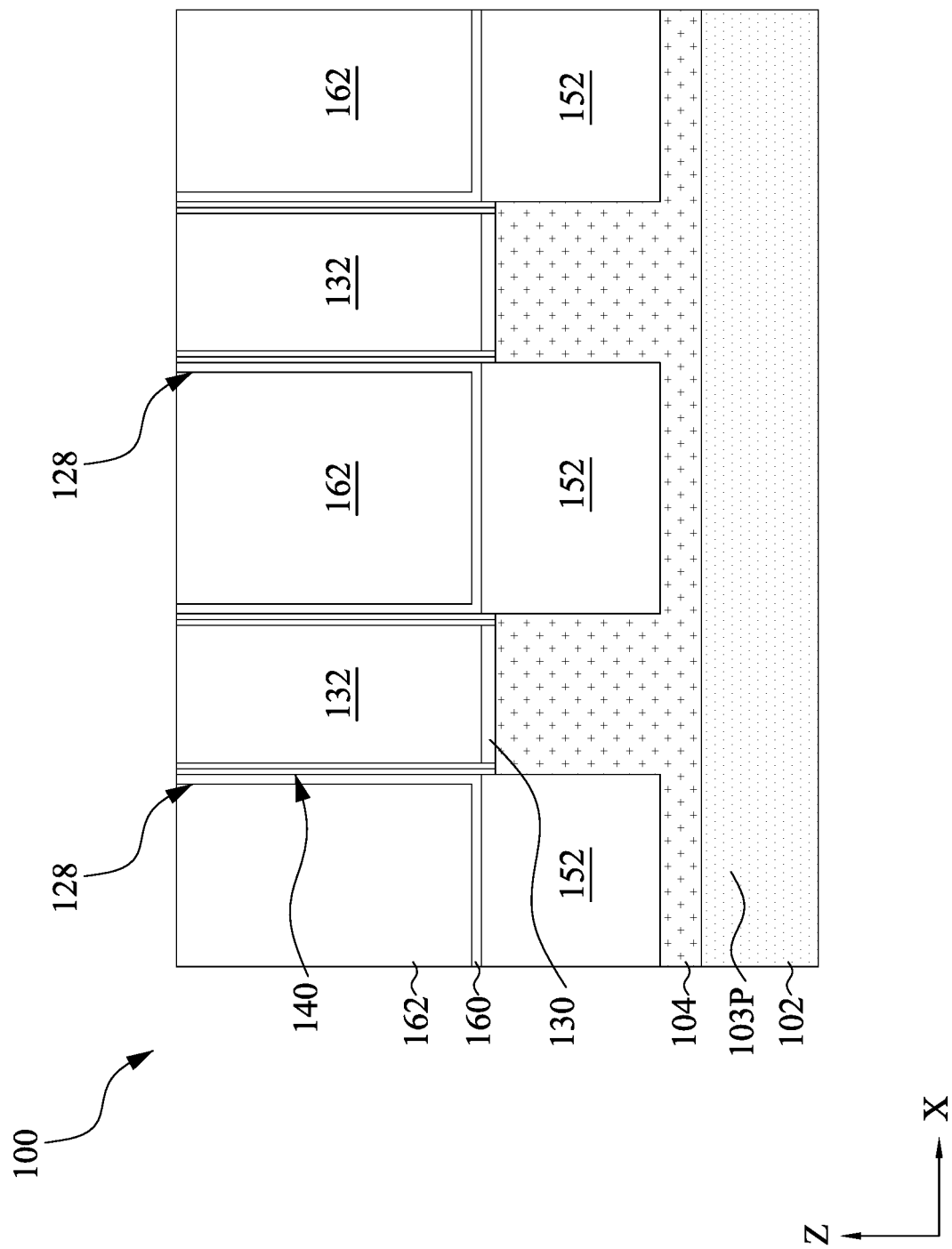
FIG. 9 is a cross-sectional side view of one of various stages of manufacturing the semiconductor device structure of FIG. 2B taken along line A-A, in accordance with some embodiments.

FIG. 9 is a cross-sectional side view of one of various stages of manufacturing the semiconductor device structure of FIG. 2B taken along line A-A, in accordance with some embodiments. As shown in FIG. 9, a planarization process is performed to expose the sacrificial gate electrode layer 132. The planarization process may be any suitable process, such as a CMP process. The planarization process removes portions of the ILD layer 162 and the CESL 160 disposed on the sacrificial gate stacks 128. The planarization process may also remove the mask structure 134 (FIG. 8A).

Figure 10A:
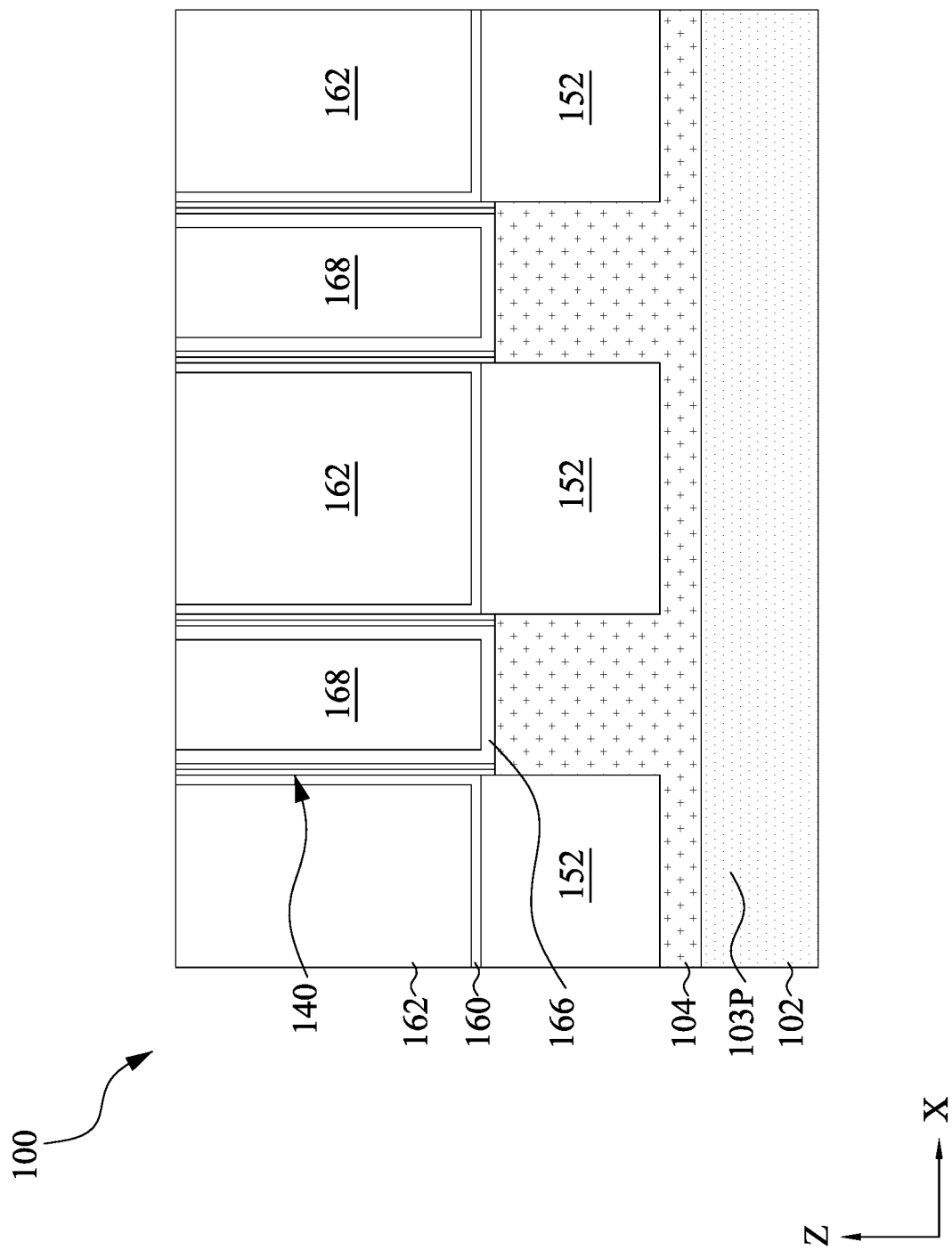
FIG. 10A is a cross-sectional side view of one of various stages of manufacturing the semiconductor device structure of FIG. 2B taken along line A-A, in accordance with some embodiments.
Figure 10B:
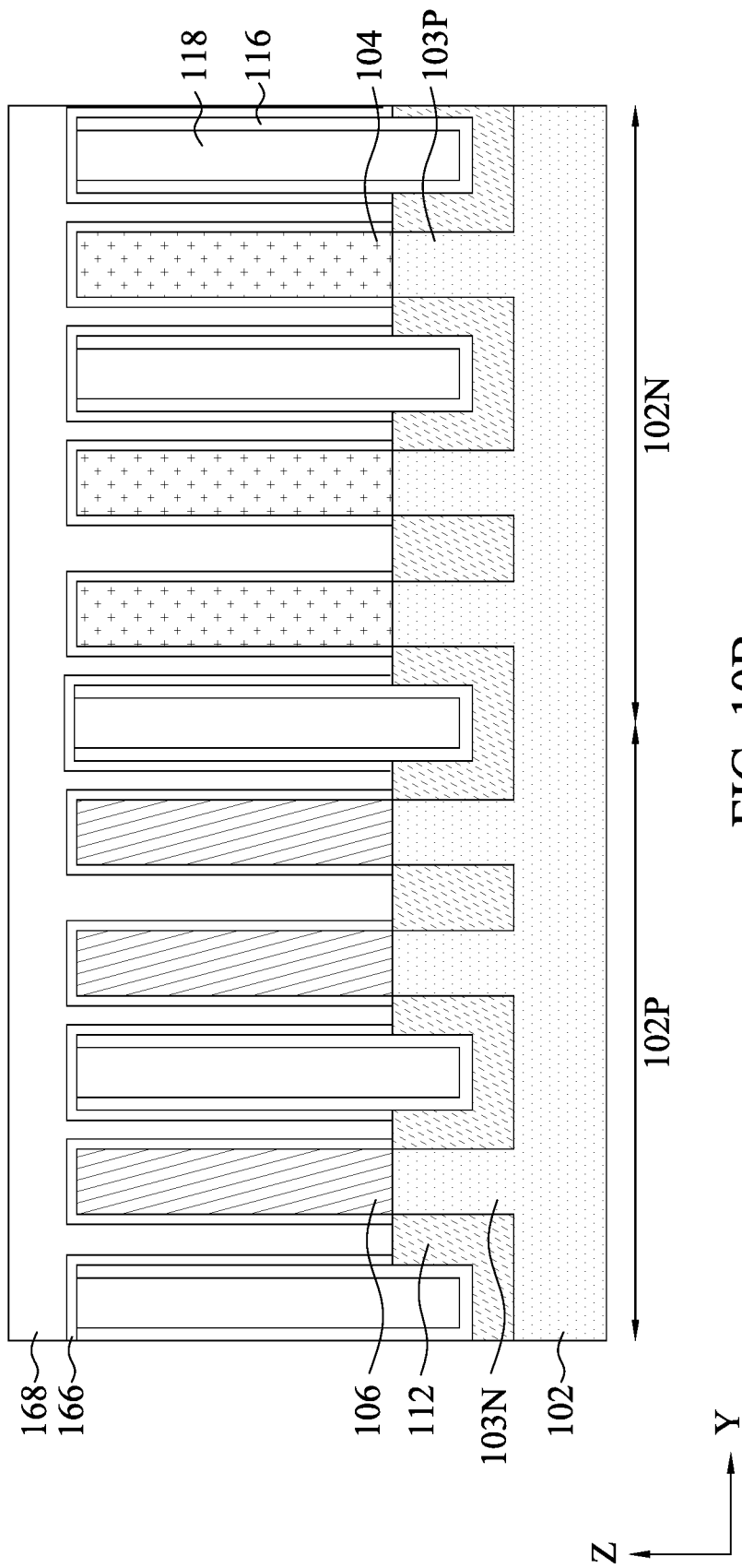
FIG. 10B is a cross-sectional side view of one of various stages of manufacturing the semiconductor device structure of FIG. 2B taken along line C-C, in accordance with some embodiments.

FIGS. 10A-10B are cross-sectional side views of one of various stages of manufacturing the semiconductor device structure 100 of FIG. 2B taken along lines A-A, C-C, respectively, in accordance with some embodiments. As shown in FIG. 10A, the sacrificial gate electrode layers 132 (FIG. 9) and the sacrificial gate dielectric layers 130 (FIG. 9) may be removed and replaced with gate dielectric layers 166 and gate electrode layers 168. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the ILD layer 162. The gate dielectric layer 166 may include one or more dielectric layers and may include the same material(s) as the sacrificial gate dielectric layer 130. In some embodiments, the gate dielectric layers 166 may be deposited by one or more ALD processes or other suitable processes. The gate electrode layer 168 includes one or more layers of electrically conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layers 168 may be formed by PVD, CVD, ALD, electro-plating, or other suitable method. The gate electrode layers 168 may be recessed to a level below the top surface of the ILD layer 162, and a self-aligned contact (SAC) layer (not shown) may be formed on each gate electrode layer 168.

In some embodiments, after removing the sacrificial gate electrode layers 132 and the sacrificial gate dielectric layers 130 but prior to forming the gate dielectric layers 166 and the gate electrode layers 168, the exposed portions of the high-K dielectric materials 120 (FIG. 1G) are removed, as shown in FIG. 10B. The removal of the portions of the high-K dielectric materials 120 may be performed by any suitable etch process, such as a dry etch process, wet etch process, or a combination thereof. Some etch processes may be selective, so the ILD layer 162, the first semiconductor layer 104, and the second semiconductor layer 106 are not substantially affected. As shown in FIG. 10B, the gate dielectric layer 166 is formed on the first semiconductor layer 104, the second semiconductor layer 106, the liner 116, and the low-K dielectric material 118. The gate electrode layer 168 is formed on the gate dielectric layer 166. In some embodiments, the portions of the high-K dielectric material 120 (FIG. 1G) located in the channel regions are removed, so one gate electrode layer 168 can connect multiple channels (i.e., the first semiconductor layer 104 and the second semiconductor layer 106). In some embodiments, some or all of the portions of the high-K dielectric material 120 are not removed, and the gate electrode layers 168 are separated by the portions of the high-K dielectric material 120.

Figure 11A:
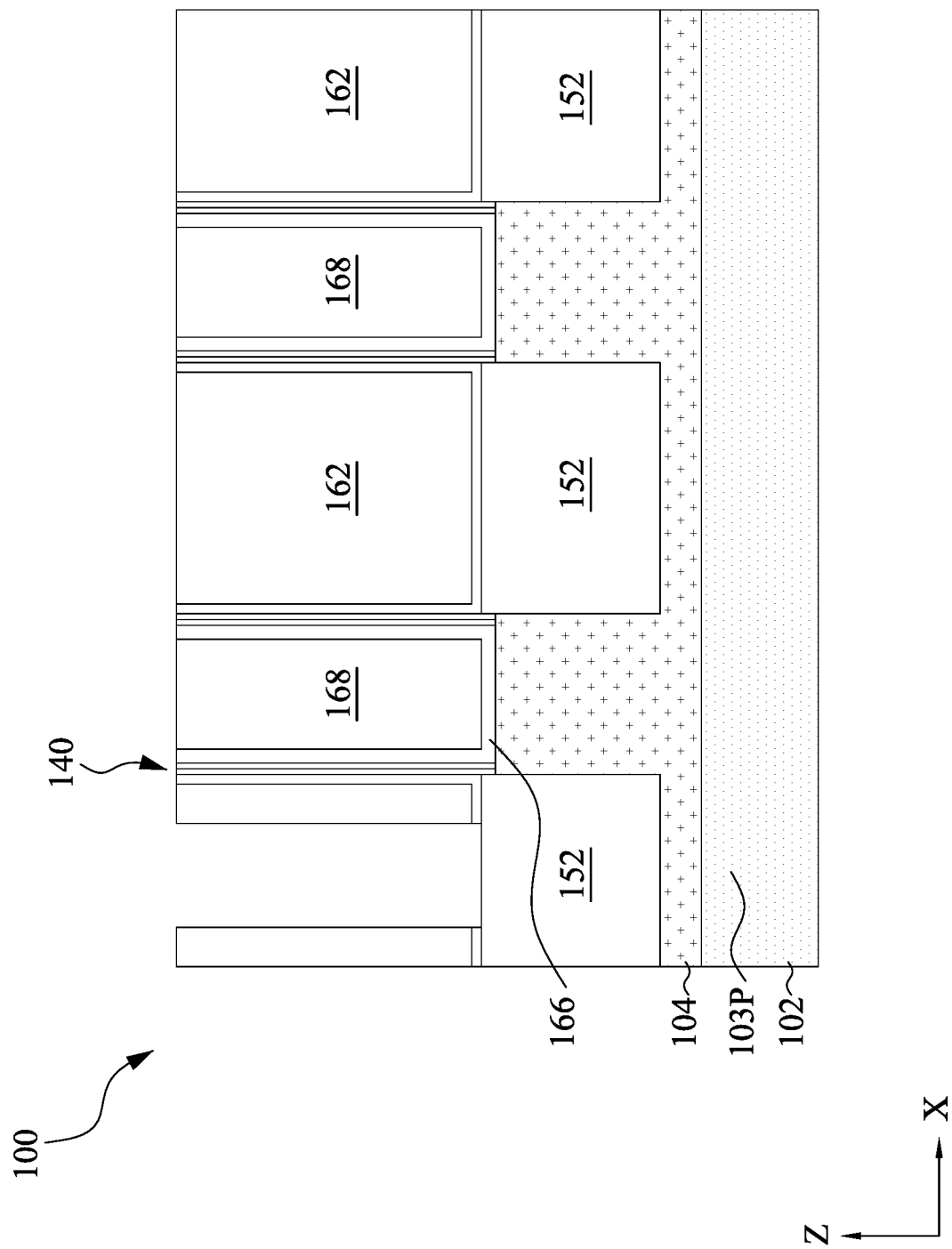
Figure 11B:
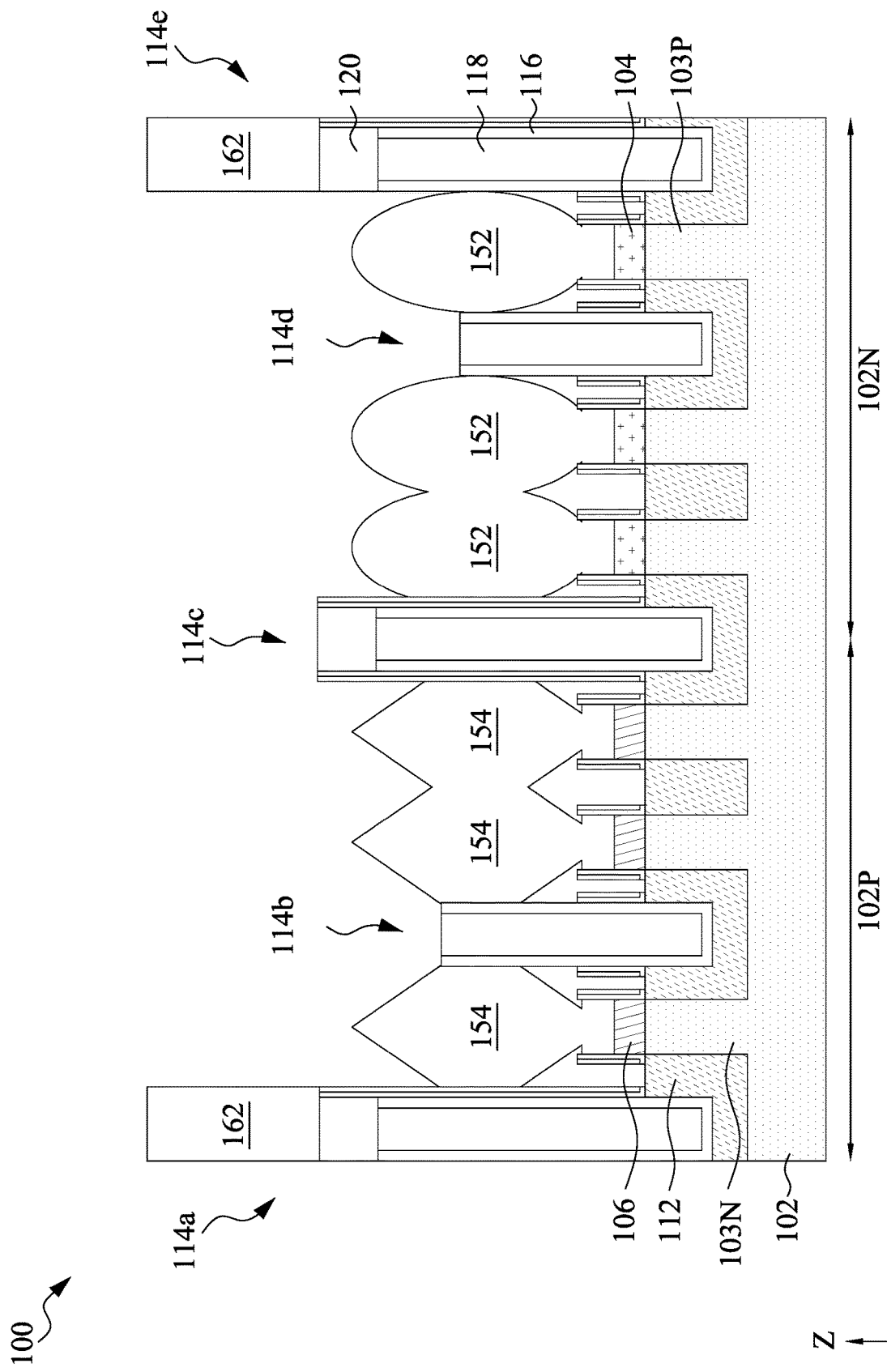
Figure 12A:
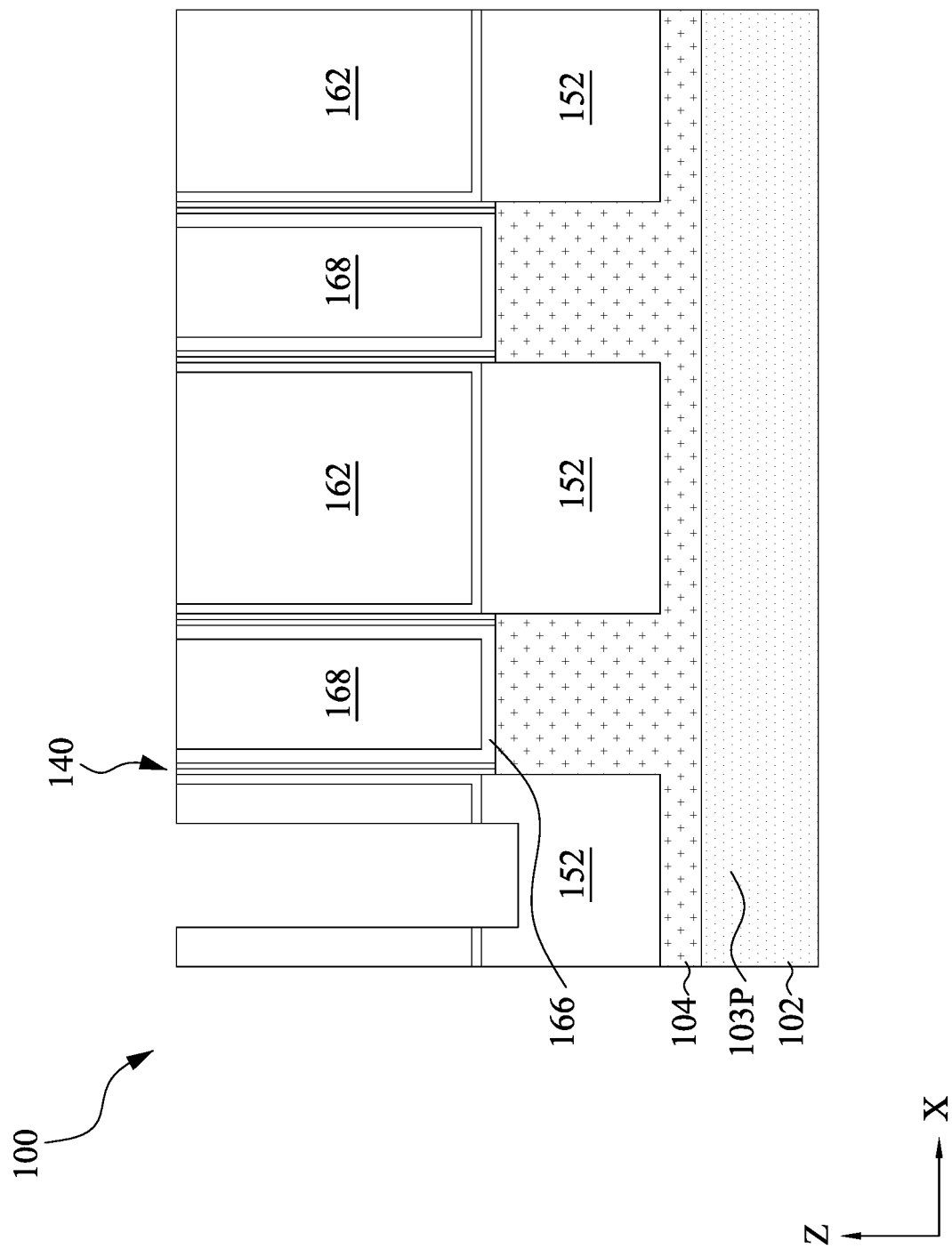
Figure 12B:
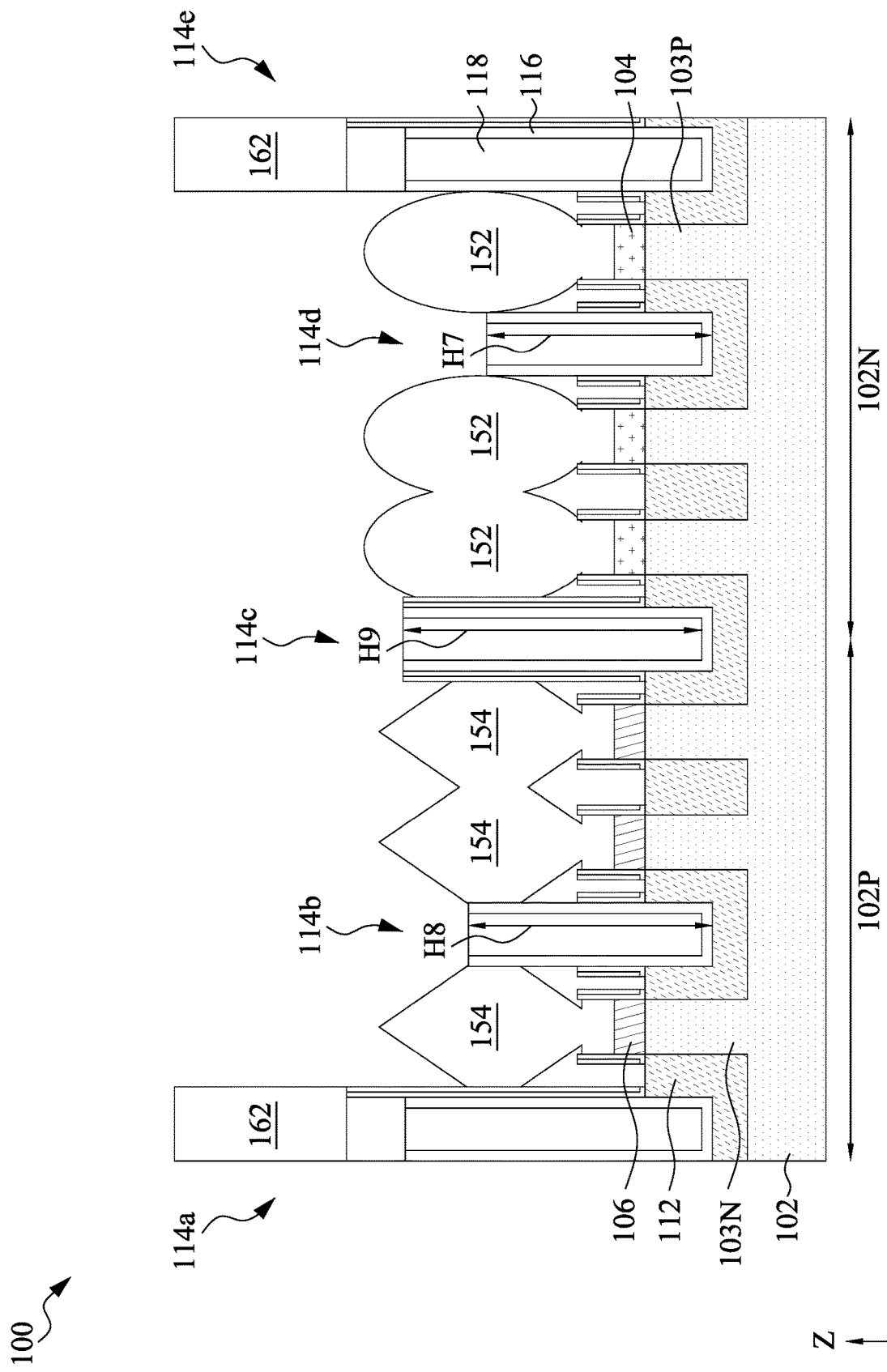

As shown in FIGS. 11A and 11B, the ILD layer 162 and the CESL 160 disposed on one side of one gate electrode layer 168 are removed, exposing the S/D epitaxial features 152, 154 and the dielectric features 114b-d. The dielectric features 114a, 114e may be still covered by the ILD layer 162. In some embodiments, the ILD layer 162 and the CESL 160 disposed on both sides of the gate electrode layers 168 are removed. Next, the dielectric features 114b-d are recessed, as shown in FIG. 12B. The recess of the 114b-d may utilize an etchant that recesses different materials at different rates. For example, the high-K dielectric material 120 (FIG. 11B) and the spacer 140 may have a first etch rate by the etchant, the liner 116 and the low-K dielectric material 118 may have a second etch rate by the etchant, and the S/D epitaxial features 152, 154 may have a third etch rate by the etchant. In some embodiments, the first etch rate is faster than the second etch rate, which is faster than the third etch rate. As a result, the high-K dielectric material 120 (FIG. 11B) of the dielectric feature 114c is removed, and the dielectric features 114b, 114d and the S/D epitaxial features 152, 154 are recessed, as shown in FIGS. 12A and 12B. After the recess process, the dielectric feature 114d has a height H7 which is less than the height H3, the dielectric feature 114b has a height H8 which is less than the height H6, and the dielectric feature 114c has a height H9. In some embodiments, the dielectric feature 114c which separates PMOS regions from NMOS regions, have the height H9 that is greater than the height H8 of the dielectric feature 114b, which separates S/D epitaxial features 154 within the PMOS region, and the height H8 is greater than the height H7 of the dielectric feature 114d, which separates S/D epitaxial features 152 within the NMOS region. In some embodiments, the height H9 is about 5 percent to about 30 percent greater than the height H7 or the height H8. For example, the height H9 may range from about 100 nm to about 300 nm, such as from about 60 nm to about 180 nm, and the height H7 or the height H8 may range from about 70 nm to about 240 nm, such as from about 50 nm to about 150 nm. In some embodiments, the height H8 is about 0 percent to about 80 percent greater than the height H7.

The dielectric features 114b-d are recessed to allow a conductive feature 172 (FIGS. 13A and 13B) subsequently formed over the S/D epitaxial features 152, 154 to have more contact area with the S/D epitaxial features 152, 154, which leads to reduced contact resistance. The dielectric feature 114d prevents S/D epitaxial features 152 disposed in the NMOS region 102N from merging and the dielectric feature 114b prevents S/D epitaxial features 154 disposed in the PMOS region 102P from merging. Thus, if the height H7 or the height H8 is less than about 70 nm, the adjacent S/D epitaxial features 152 or 154 may merge. On the other hand, if the height H7 or the height H8 is greater than about 240 nm, the conductive feature 172 may not have sufficient contact area with the S/D epitaxial features 152, 154 to achieve reduced contact resistance.

The S/D epitaxial features 152, 154 may be recessed as a result of recessing the dielectric feature 114c as shown in FIGS. 12A and 12B. In some embodiments, about 40 percent to about 70 percent of the volume of the single S/D epitaxial feature 154 is recessed, and about 30 percent to about 50 percent of the volume of the merged S/D epitaxial feature 154 is recessed. In some embodiments, about 50 percent to about 80 percent of the volume of the S/D epitaxial feature 152 is recessed, and about 40 percent to about 70 percent of the volume of the merged S/D epitaxial feature 152 is recessed. The single recessed S/D epitaxial features 152, 154 may each have a width ranging from about 20 nm to about 50 nm and a height ranging from about 20 nm to about 40 nm. The merged S/D epitaxial features 152 may have a width ranging from about 40 nm to about 80 nm and a height ranging from about 50 nm to about 70 nm. The merged S/D epitaxial features 154 may have a width ranging from about 40 nm to about 80 nm and a height ranging from about 30 nm to about 50 nm.

Figure 13A:
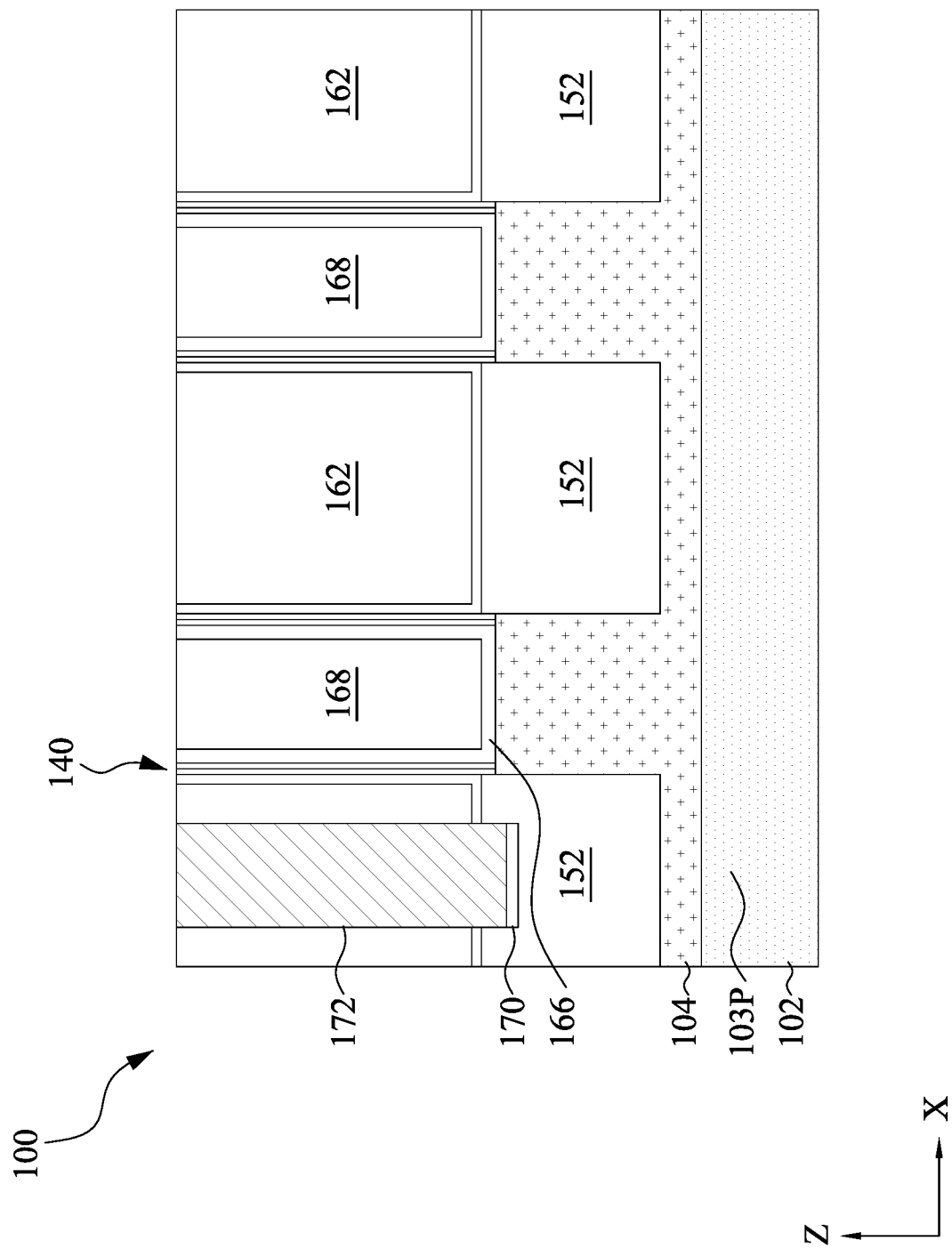
Figure 13B:
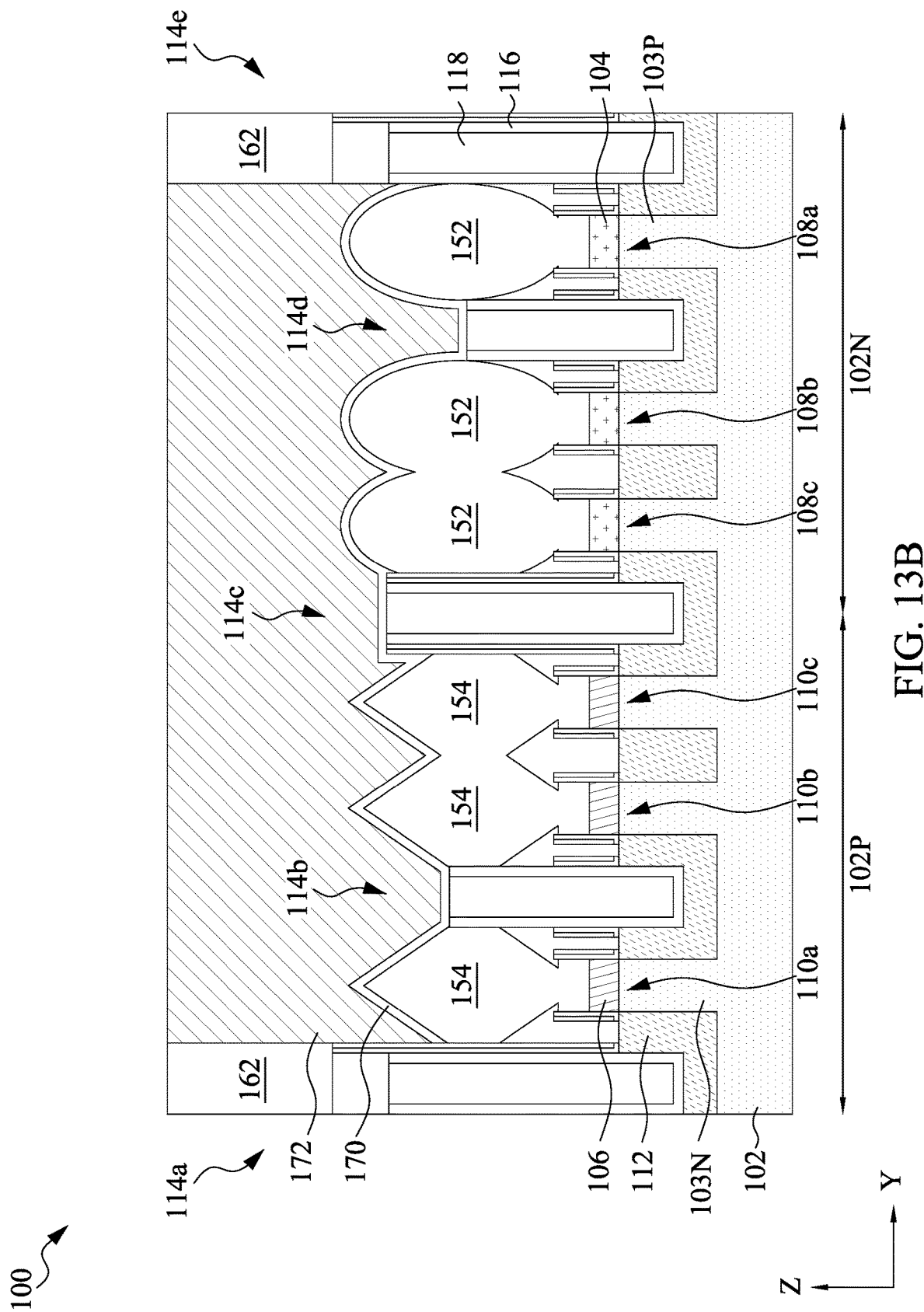

As shown in FIGS. 13A and 13B, the conductive feature 172 is formed over the S/D epitaxial features 152, 154 and the dielectric features 114a-e. The conductive feature 172 may include an electrically conductive material, such as one or more of Ru, Mo, Co, Ni. W, Ti, Ta, Cu, Al, TiN and TaN. The conductive feature 172 may be formed by any suitable process, such as PVD, CVD, ALD, electro-plating, or other suitable method. The conductive feature 172 may include a continuous material disposed over the S/D epitaxial features 152, 154 and the dielectric features 114a-e. A silicide layer 170 may be formed between each S/D epitaxial feature 152, 154 and the conductive feature 172, as shown in FIGS. 13A and 13B. The silicide layer 170 may be also formed between each dielectric feature 114b, 114c, 114d and the conductive feature 172. The silicide layer 170 may include one or more of WSi, CoSi, NiSi, TiSi, MoSi or TaSi. In some embodiments, the portions of the silicide layer 170 disposed between the S/D epitaxial features 152, 154 and the conductive feature 172 may have the same or a different composition compared to the portions of the silicide layer 170 disposed between the dielectric features 114b, 114c, 114d and the conductive feature 172. In some embodiments, the portion of the silicide layer 170 formed between the dielectric features 114b, 114c, 114d and the conductive feature 172 has a thickness less than a thickness of the portion of the silicide layer 170 formed between the S/D epitaxial features 152, 154 and the conductive feature 172.

Figure 14:
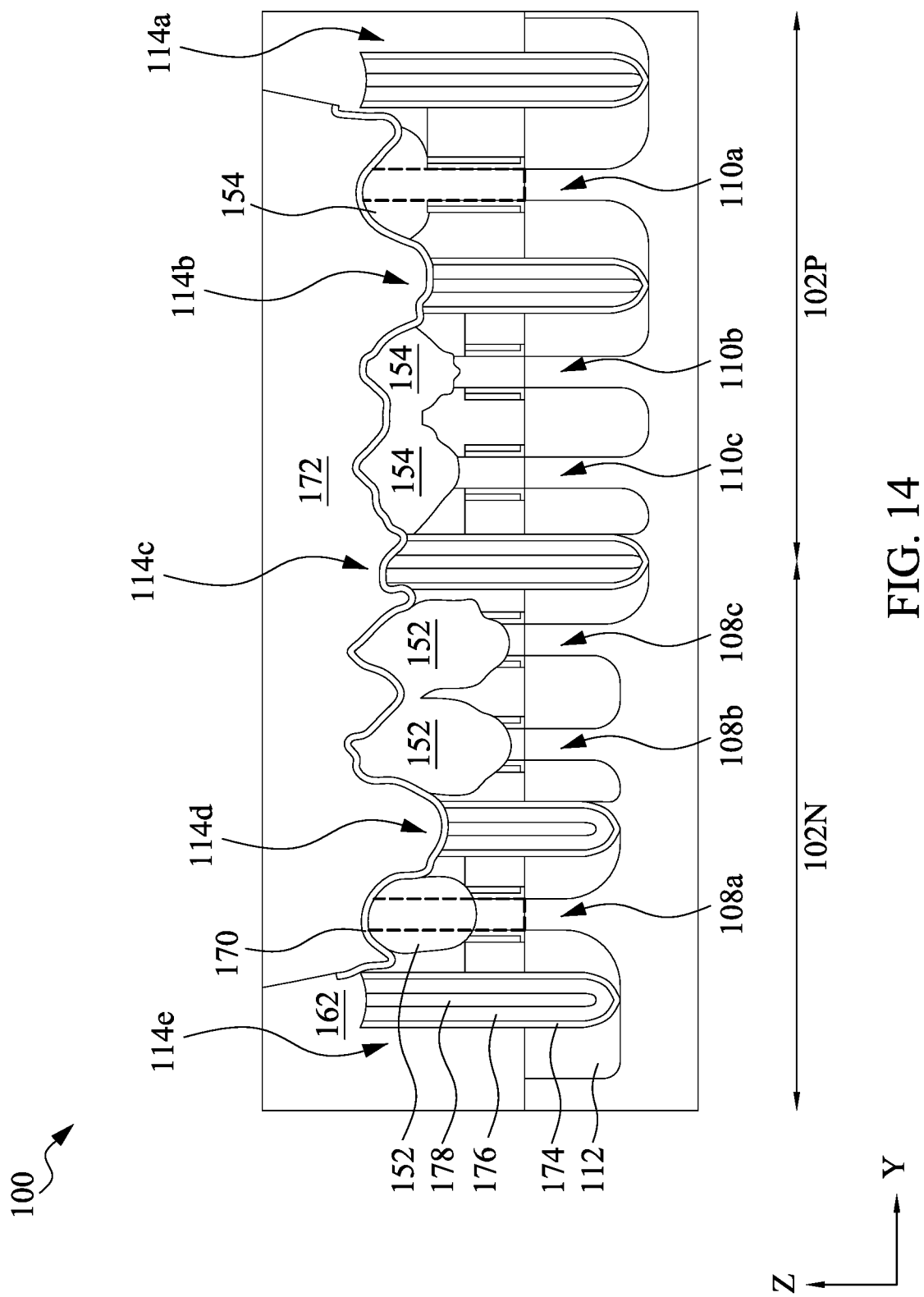
FIG. 14 is a cross-sectional side view of a stage of manufacturing the semiconductor device structure of FIG. 2B taken along line B-B, in accordance with some embodiments.

FIG. 14 is a cross-sectional side view of a stage of manufacturing the semiconductor device structure 100 of FIG. 2B taken along line B-B, in accordance with some embodiments. The semiconductor device structure 100 shown in FIG. 14 may be an alternative embodiment of the semiconductor device structure 100 shown in FIG. 13B. As shown in FIG. 14, each dielectric feature 114a-e includes a first dielectric material 174, a second dielectric material 176, and a third dielectric material 178. In some embodiments, the first, second, and third dielectric materials 174, 176, 178 include silicon nitride with different amounts of nitrogen content. For example, the first dielectric material 174 includes a first atomic percentage of nitrogen, the second dielectric material 176 includes a second atomic percentage of nitrogen greater than the first atomic percentage of nitrogen, and the third dielectric material 178 includes a third atomic percentage of nitrogen greater than the second atomic percentage of nitrogen. In some embodiments, the fins 108a-c in the NMOS region 102N are shallower than the fins 110a-c in the PMOS region 102P. In other words, the fins 110a-c in the PMOS region 102P extend deeper into the substrate 102. The different depths of the fins 108a-c and 110a-c may be formed during the process described in FIG. 1C. For example, the fins 108a-c and the fins 110a-c may be formed at different times, thus may have different depths. As shown in FIG. 14, the dielectric features 114a-e may have convex and concave top surfaces as the result of one or more etch processes performed to recess the heights of the dielectric features 114a-e.

The present disclosure provides a semiconductor device structure 100 including dielectric features 114b-d between S/D epitaxial features 152, 154 and a conductive feature 172 disposed over the S/D epitaxial features 152, 154 and the dielectric features 114b-d. The dielectric features 114b-d are recessed to various heights in order to prevent adjacent S/D epitaxial features 152, 154 from unintentionally merging while allowing more contact area for the conductive feature 172 over the S/D epitaxial features 152, 154. Some embodiments may achieve advantages. For example, the increased contact area of the conductive feature 172 over the S/D epitaxial features 152, 154 reduces contact resistance.

An embodiment is a semiconductor device structure. The semiconductor device structure includes a first source/drain epitaxial feature disposed in an NMOS region, a second source/drain epitaxial feature disposed in the NMOS region, a first dielectric feature disposed between the first source/drain epitaxial feature and the second source/drain epitaxial feature, a third source/drain epitaxial feature disposed in a PMOS region, a second dielectric feature disposed between the second source/drain epitaxial feature and the third source/drain epitaxial feature, and a conductive feature disposed over the first, second, and third source/drain epitaxial features and the first and second dielectric features.

Another embodiment is a semiconductor device structure. The semiconductor device structure includes a first source/drain epitaxial feature disposed in an NMOS region, a second source/drain epitaxial feature disposed in the NMOS region, and a first dielectric feature disposed between the first source/drain epitaxial feature and the second source/drain epitaxial feature. The first dielectric feature has a first height. The semiconductor device structure further includes a third source/drain epitaxial feature disposed in a PMOS region and a second dielectric feature disposed between the second source/drain epitaxial feature and the third source/drain epitaxial feature. The second dielectric feature has a second height substantially greater than the first height. The semiconductor device structure further includes a fourth source/drain epitaxial feature disposed in the PMOS region and a third dielectric feature disposed between the third source/drain epitaxial feature and the fourth source/drain epitaxial feature. The third dielectric feature has a third height substantially less than the second height and substantially greater than the first height.

A further embodiment is a method. The method includes forming first, second, and third semiconductor fins in an NMOS region and fourth, fifth, and sixth semiconductor fins in a PMOS region; forming a first dielectric feature between the first and second semiconductor fins, a second dielectric feature between the third and fourth semiconductor fins, and a third dielectric feature between the fifth and sixth semiconductor fins; recessing the first, second, and third semiconductor fins and the first dielectric feature; forming a first source/drain epitaxial feature on the recessed first semiconductor fin, a second source/drain epitaxial feature on the recessed second semiconductor fin, and a third source/drain epitaxial feature on the recessed third semiconductor fin; recessing the fourth, fifth, and sixth semiconductor fins and the third dielectric feature; forming a fourth source/drain epitaxial feature on the recessed fourth semiconductor fin, a fifth source/drain epitaxial feature on the recessed fifth semiconductor fin, and a sixth source/drain epitaxial feature on the recessed sixth semiconductor fin; forming an interlayer dielectric layer over the first, second, third, fourth, fifth, and sixth source/drain epitaxial features and the first, second, and third dielectric features; removing a portion of the interlayer dielectric layer to expose the first, second, third, fourth, fifth, and sixth source/drain epitaxial features and the first, second, and third dielectric features; recessing the first, second, third, fourth, fifth, and sixth source/drain epitaxial features and the first, second, and third dielectric features; and forming a conductive feature over the first, second, third, fourth, fifth, and sixth source/drain epitaxial features and the first, second, and third dielectric features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
  a first source/drain epitaxial feature disposed in an NMOS region;
  a second source/drain epitaxial feature disposed in the NMOS region;
  a first dielectric feature disposed between the first source/drain epitaxial feature and the second source/drain epitaxial feature;
  a third source/drain epitaxial feature disposed in a PMOS region;
  a fourth source/drain epitaxial feature disposed in the PMOS region;
  a second dielectric feature disposed between the third source/drain epitaxial feature and the fourth source/drain epitaxial feature, wherein the second dielectric feature has a height substantially greater than a height of the first dielectric feature; and
  a conductive feature disposed over the first, second, third, and fourth source/drain epitaxial features and the first and second dielectric features.

2. The semiconductor device structure of claim 1, further comprising a fifth source/drain epitaxial feature disposed in the NMOS region, wherein the fifth source/drain epitaxial feature is merged with the second source/drain epitaxial feature.

3. The semiconductor device structure of claim 2, further comprising a sixth source/drain epitaxial feature disposed in the PMOS region between the third source/drain epitaxial feature and the second dielectric feature, wherein the sixth source/drain epitaxial feature is merged with the third source/drain epitaxial feature.

4. The semiconductor device structure of claim 3, wherein the conductive feature is disposed over the fourth, fifth and sixth source/drain epitaxial features.

5. The semiconductor device structure of claim 4, further comprising a silicide layer having first portions and second portions, wherein the first portions are disposed between each of the first, second, third, fourth, fifth, and sixth source/drain epitaxial feature and the conductive feature, and the second portions are disposed between each of the first and second dielectric feature and the conductive feature.

6. The semiconductor device structure of claim 5, wherein the first portions of the silicide layer have a composition different from a composition of the second portions of the silicide layer.

7. A semiconductor device structure, comprising:
  a first source/drain epitaxial feature disposed in an NMOS region;

a second source/drain epitaxial feature disposed in the NMOS region;
a first dielectric feature disposed between the first source/drain epitaxial feature and the second source/drain epitaxial feature, wherein the first dielectric feature has a first height;
a third source/drain epitaxial feature disposed in a PMOS region;
a second dielectric feature disposed between the second source/drain epitaxial feature and the third source/drain epitaxial feature, wherein the second dielectric feature has a second height substantially greater than the first height;
a fourth source/drain epitaxial feature disposed in the PMOS region; and
a third dielectric feature disposed between the third source/drain epitaxial feature and the fourth source/drain epitaxial feature, wherein the third dielectric feature has a third height substantially less than the second height and substantially greater than the first height.

8. The semiconductor device structure of claim 7, wherein the first, second, and third dielectric features each comprises a liner and a low-K dielectric material disposed on the liner.

9. The semiconductor device structure of claim 7, further comprising a fifth source/drain epitaxial feature disposed in the NMOS region between the second source/drain epitaxial feature and the second dielectric feature, wherein the fifth source/drain epitaxial feature is merged with the second source/drain epitaxial feature.

10. The semiconductor device structure of claim 9, further comprising a sixth source/drain epitaxial feature disposed in the PMOS region between the third source/drain epitaxial feature and the third dielectric feature, wherein the sixth source/drain epitaxial feature is merged with the third source/drain epitaxial feature.

11. The semiconductor device structure of claim 7, further comprising a first semiconductor layer in contact with the first source/drain epitaxial feature and a second semiconductor layer in contact with the third source/drain epitaxial feature.

12. The semiconductor device structure of claim 11, further comprising a gate electrode layer disposed over the first semiconductor layer.

13. The semiconductor device structure of claim 12, wherein the gate electrode layer is disposed over the second semiconductor layer.

14. A method for forming a semiconductor device structure, comprising:
forming first, second, and third semiconductor fins in an NMOS region and fourth, fifth, and sixth semiconductor fins in a PMOS region;
forming a first dielectric feature between the first and second semiconductor fins, a second dielectric feature between the third and fourth semiconductor fins, and a third dielectric feature between the fifth and sixth semiconductor fins;
recessing the first, second, and third semiconductor fins and the first dielectric feature;
forming a first source/drain epitaxial feature on the recessed first semiconductor fin, a second source/drain epitaxial feature on the recessed second semiconductor fin, and a third source/drain epitaxial feature on the recessed third semiconductor fin;
recessing the fourth, fifth, and sixth semiconductor fins and the third dielectric feature;
forming a fourth source/drain epitaxial feature on the recessed fourth semiconductor fin, a fifth source/drain epitaxial feature on the recessed fifth semiconductor fin, and a sixth source/drain epitaxial feature on the recessed sixth semiconductor fin;
forming an interlayer dielectric layer over the first, second, third, fourth, fifth, and sixth source/drain epitaxial features and the first, second, and third dielectric features;
removing a portion of the interlayer dielectric layer to expose the first, second, third, fourth, fifth, and sixth source/drain epitaxial features and the first, second, and third dielectric features;
recessing the first, second, third, fourth, fifth, and sixth source/drain epitaxial features and the first, second, and third dielectric features by an etch process, wherein an etch rate of the second dielectric feature is substantially greater than an etch rate of the first dielectric feature during the etch process; and
forming a conductive feature over the first, second, third, fourth, fifth, and sixth source/drain epitaxial features and the first, second, and third dielectric features.

15. The method of claim 14, further comprising forming a sacrificial gate stack over portions of the first, second, third, fourth, fifth, and sixth semiconductor fins and the first, second, and third dielectric features.

16. The method of claim 15, further comprising removing the sacrificial gate stack and forming a gate dielectric layer and a gate electrode layer over the portions of the first, second, third, fourth, fifth, and sixth semiconductor fins and the first, second, and third dielectric features.

17. The method of claim 16, further comprising forming a contact etch stop layer over the first, second, third, fourth, fifth, and sixth source/drain epitaxial features and the first, second, and third dielectric features, wherein the interlayer dielectric layer is formed on the contact etch stop layer.

18. The method of claim 17, further comprising forming a silicide layer on the first, second, third, fourth, fifth, and sixth source/drain epitaxial features and on the first, second, and third dielectric features, wherein the conductive feature is formed on the silicide layers.

19. The method of claim 17, further comprising removing a portion of the contact etch stop layer prior to recessing the first, second, third, fourth, fifth, and sixth source/drain epitaxial features and the first, second, and third dielectric features.

20. The method of claim 14, wherein an etch rate of the second dielectric feature is substantially greater than an etch rate of the third dielectric feature during the etch process.

* * * * *